United States Patent
Shima

(10) Patent No.: US 7,098,111 B2
(45) Date of Patent: Aug. 29, 2006

(54) MANUFACTURING METHOD OF SEMICONDUCTOR INTEGRATED CIRCUIT DEVICE

(75) Inventor: Akio Shima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/948,142

(22) Filed: Sep. 24, 2004

(65) Prior Publication Data

US 2005/0064664 A1   Mar. 24, 2005

(30) Foreign Application Priority Data

Sep. 24, 2003   (JP)   ............... 2003-331810

(51) Int. Cl.
*H01L 21/336*   (2006.01)
(52) U.S. Cl. ............... 438/303; 438/305; 438/308
(58) Field of Classification Search ......... 438/275–309
See application file for complete search history.

(56) References Cited

U.S. PATENT DOCUMENTS 5,956,603 A * 9/1999 Talwar et al. ............... 438/520
6,380,044 B1 * 4/2002 Talwar et al. ............... 438/308
2004/0132293 A1 * 7/2004 Takayama et al. .......... 438/689
2004/0245583 A1 * 12/2004 Horiuchi et al. ............ 257/408

FOREIGN PATENT DOCUMENTS

JP   2001-189458   7/2001
JP   2002-050766   2/2002

* cited by examiner

*Primary Examiner*—H. Jey Tsai
(74) *Attorney, Agent, or Firm*—Antonelli, Terry, Stout and Kraus, LLP.

(57) ABSTRACT

A manufacturing technology of a MOSFET having a shallow junction and a source and drain of a low resistance is provided. After having ion-implanted an As on the surface of a p type well forming a gate electrode, a surface protection layer and an energy absorber layer are deposited on a substrate. When the surface of the substrate is irradiated by a YAG laser beam of the wavelength of 1064 nm for one nano second to 999 nano seconds, a heat absorbed by the energy absorber layer is transmitted to the substrate in an ultra short time, and heats its surface to a melting temperature, and therefore, the impurity is activated, and an extension region of a low resistance is formed in an extremely shallow region of about 20 nm in depth from the surface of the p type well.

16 Claims, 18 Drawing Sheets

MANUFACTURING METHOD OF SEMICONDUCTOR INTEGRATED CIRCUIT DEVICE

CROSS-REFERENCE TO RELATED APPLICATION

The present application claims priority from Japanese Patent Application No. JP 2003-331810 filed on Sep. 24, 2003, the content of which is hereby incorporated by reference into this application.

TECHNICAL FIELD OF THE INVENTION

The present invention relates to a manufacturing method of a semiconductor integrated circuit device, and more in particular, it relates to a technology effectively applied to micro-fabrication of an insulated gate type field effect transistor.

BACKGROUND OF THE INVENTION

In general, accompanied with high integration of a semiconductor integrated circuit by micro-fabrication of an insulated gate type field effect transistor (hereinafter referred to as MOSFET), a demand for shallow junction of a source and drain (particularly, a low impurity concentration diffused layer referred to as an extension region) of the MOSFET is severe and, in order to develop an ultra-micro MOSFET with a gate length of not more than 70 nm of the next and thereafter generation, a technology capable of forming the source and drain of an ultra shallow junction of such as about 20 nm in depth and 400 Ω/sq in resistance value and having a low resistance is required.

In the case of the MOSFET which is currently under development and about 90 nm in the gate length, the source and drain of about 30 nm in junction depth and about 800 Ω/sq in resistance value are realized by a conventional ultra-low energy ion implantation process and a subsequent short-time high temperature lamp annealing heat treatment of about 1000° C. and about one second by a W (tungsten) halogen lamp. This heat treatment is a lamp heating by a W lamp for heating a whole wafer at once or a heat treatment by batch type furnace tube, and does not selectively heat-treat a specific region within a semiconductor chip.

Japanese Patent Application Laid-Open Publication No. 2001-189458 has disclosed a technology, in which a W silicide layer is formed on a non-crystal silicon layer formed on a substrate, and after that, an electromagnetic wave such as a high frequency wave or a YAG laser beam and the like is irradiated on the W silicide layer so that the W silicide layer is allowed to generate heat, and by utilizing this heat, the non-crystal silicon layer is converted into a poly silicon layer.

Japanese Patent Application Laid-Open Publication No. 2002-050766 has disclosed a technology, in which a non-crystal silicon layer, an absorber layer and an anti-reflection layer are formed on a glass substrate, and after that, a continuous oscillation type YAG laser beam is irradiated on the absorber layer through the anti-reflection layer so that the absorber layer is allowed to generate heat, and by utilizing this heat, the non-crystal layer is crystallized.

SUMMARY OF THE INVENTION

As described above, to develop an ultra-micro MOSFET of not more than 70 nm in the gate length, a source and drain of an ultra shallow junction of about 20 nm in junction depth and 400 Ω/sq in resistance value and having a low resistance are required.

However, according to the conventional ultra low energy ion implantation and the subsequent short-time high temperature lamp annealing by the W halogen lamp, since diffusion of the impurity is not negligible, it is not possible to form the source and drain satisfying the above described requirement. This is because, according to the annealing by the W halogen lamp, an execution heat treatment time, if heating and cooling times are included, takes a few to several dozen seconds, so that a thermal budget is too high to satisfy the above described requirement value. Further, there is a problem in that no chamber of the annealing apparatus capable of enduring the thermal budget is available.

Heretofore, as an impurity to form an n type doping layer, an As (arsenic) and a P (phosphorus) have been used. This is because, as long as a thermal equilibrium process such as a lamp annealing and the like is applied, they surpass a Sb (antimony) regarding solubility limit. However, the As and the P have a problem in that they easily become inactivated during other heat treatment processes indispensable for the formation of an actual device subsequent to a high temperature activated process.

In the case of a high value added consolidation device such as a logic device or a memory device constituting a circuit by a complementary type MOSFET (CMOSFET) or a BiCMOSFET device constituting a circuit by the CMOSFET and a bipolar transistor, in general, a CMOS logic portion has been formed prior to a bipolar portion and a memory portion, and, when the subsequent bipolar portion and memory portion are attempted to be formed without varying CMOS characteristics, the thermal budget (heat treatment temperature and heat treatment time) of the bipolar portion and the memory portion have been restricted. Further, for example, the variation of the CMOS characteristics has been evitable even if the thermal budget of the bipolar portion and the memory portion are reduced.

Consequently, while a technology for selectively annealing specific portions within the semiconductor chip (the CMOS logic portion, the bipolar portion and the memory portion) has been required, for example, according to the excimer laser beam, absorption efficiency for the silicon has been too high, and it was impossible for the conventional technology to perform an annealing by selectively applying the thermal budget on the specific portions within the chip.

An object of the present invention is to provide a technology for manufacturing a MOSFET having the source and drain of an ultra-shallow junction and a low resistance.

Another object of the present invention is to provide a technology capable of selectively annealing the specific portions within the semiconductor chip.

The above described and other objects and new features will become apparent from the following description of the specification and the accompanying drawings.

From among the inventions disclosed in the present application, an outline of the representative invention will be simply described as follows.

The manufacturing method of the semiconductor integrated circuit device of the present invention includes the following steps:

(a) a step in which a gate insulator is formed on a main surface of a semiconductor substrate, and a gate electrode is formed on the gate insulator;

(b) a step in which the impurity is ion-implanted on the main surface of the semiconductor substrate subsequent to the step (a);

(c) a step in which an energy absorber layer comprising a thin film mainly comprised of a metal is formed on the main surface of the semiconductor substrate subsequent to the step (b); and (d) a step in which the heat of the energy absorbing layer heated by the irradiation of laser beam is transferred to the semiconductor substrate so as to anneal the main surface, so that the impurity is activated, thereby forming an extension region constituting a part of the source and the drain of the MOSFET on the main surface.

From among the inventions disclosed in the present application, an effect obtained by the representative invention will be simply described as follows.

The energy absorber layer formed on the semiconductor layer is irradiated and heated by the laser beam, and this heat is transferred to the semiconductor substrate so as to anneal its main surface, so that a desired region of the semiconductor substrate can be subjected to heating at high temperature in an ultra-short period of time, and therefore, the source and the drain of an ultra-shallow junction and a low resistance can be achieved.

BRIEF DESCRIPTIONS OF THE DRAWINGS

DESCRIPTION OF THE PREFERRED EMBODIMENTS

Figure 1:
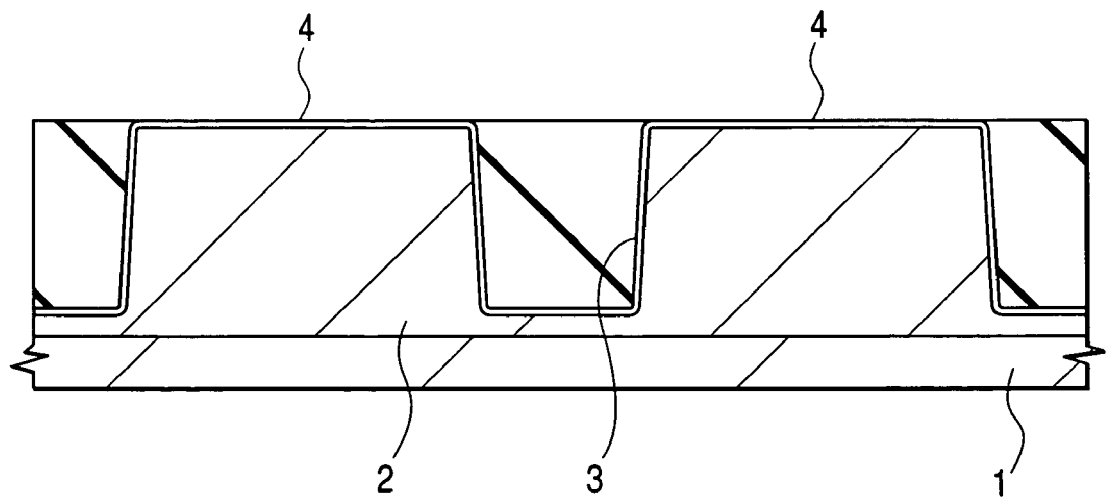
FIG. 1 is a main component sectional view of a semiconductor substrate showing a manufacturing method of a semiconductor integrated circuit device which is one embodiment of the present invention.

An embodiment of the present invention will be described below in detail with reference to the accompanying drawings. In all the drawings for explaining the embodiment, the same reference numeral will be attached to the same part in principle, and the repletion of the description thereof will be omitted.

First Embodiment

The present embodiment 1 is adapted to a manufacturing method of a semiconductor integrated circuit constituted by a CMOSFET. Here, though a description will be made on an n channel type MISFET, by reversing a conductive type of impurities, a p channel type MISFET can be manufactured in like manner.

First, as shown in FIG. 1, for example, an isolation between active devices 3 is formed on a main surface of a semiconductor substrate 1 (hereinafter referred to as a substrate) comprising a p type single crystal silicon of a plane direction (100), and subsequently, a B (boron) is ion-implanted into the substrate 1, and after that, by a heat treatment, the B is activated so that a p type well 2 is formed. Next, a threshold voltage adjustment impurity is ion-implanted on the surface of an activated region defined by the isolation between active devices 3, and this impurity is activated by the heat treatment, and after that, a gate insulator 4 comprising an oxynitrding silicon layer is formed on the surface of the activated region.

The isolation between active devices 3 is formed, for example, by etching a part of the substrate 1 so as to form a groove of about 350 nm in depth, and subsequently, depositing an oxidized silicon layer on the substrate 1 including the inside of this groove by CVD method, and after that, removing the oxidized silicon layer of the outside of the groove by chemical mechanical polishing. Further, the gate insulator 4, for example, thermally oxides the substrate 1 and forms the oxidized silicon layer on an oxidized silicon layer of about 1.3 nm in thickness on the surface of the p type well 2, and subsequently by subjecting the substrate 1 to a nitriding process in the atmosphere including a NO gas, the above described oxidized silicon layer is made into a silicon nitride layer of about 1.5 nm in thickness.

Figure 2:
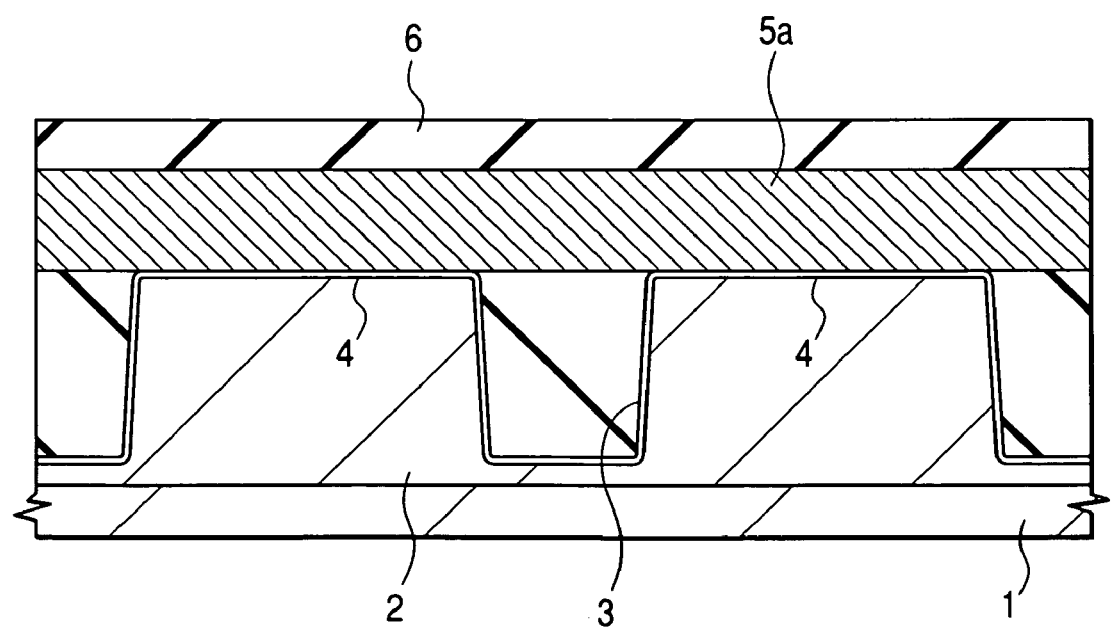
FIG. 2 is a main component sectional view of the semiconductor substrate showing the manufacturing method of the semiconductor integrated circuit device continuing to FIG. 1.

Next, as shown in FIG. 2, a poly silicon layer 5a of about 50 nm in thickness is deposited above the gate insulator 4 by the CVD method, and subsequently, by ion-implanting a P (phosphorous) into the poly silicon layer 5, its conductive type is turned into an n type. Next, an oxidized silicon layer 6 of about 10 nm in thickness is deposited over the poly silicon layer 5a. The oxidized silicon layer 6 is an insulator for protecting the upper surface of the gate electrode.

Figure 3:
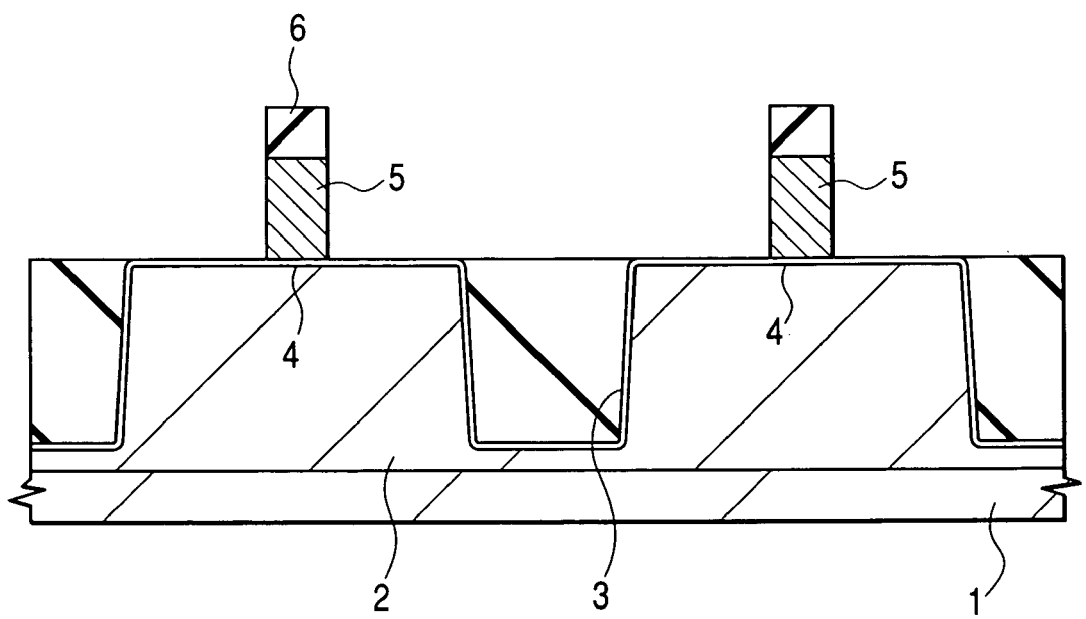
FIG. 3 is a main component sectional view of the semiconductor substrate showing the manufacturing method of the semiconductor integrated circuit device continuing to FIG. 2.

Next, as shown in FIG. 3, by patterning the oxidized silicon layer 6 and the poly silicon layer 5a by dry etching with using a photoresist layer as a mask, the gate electrode 5 comprising the n type poly silicon layer 5a is formed on the gate insulator 4.

Figure 4:
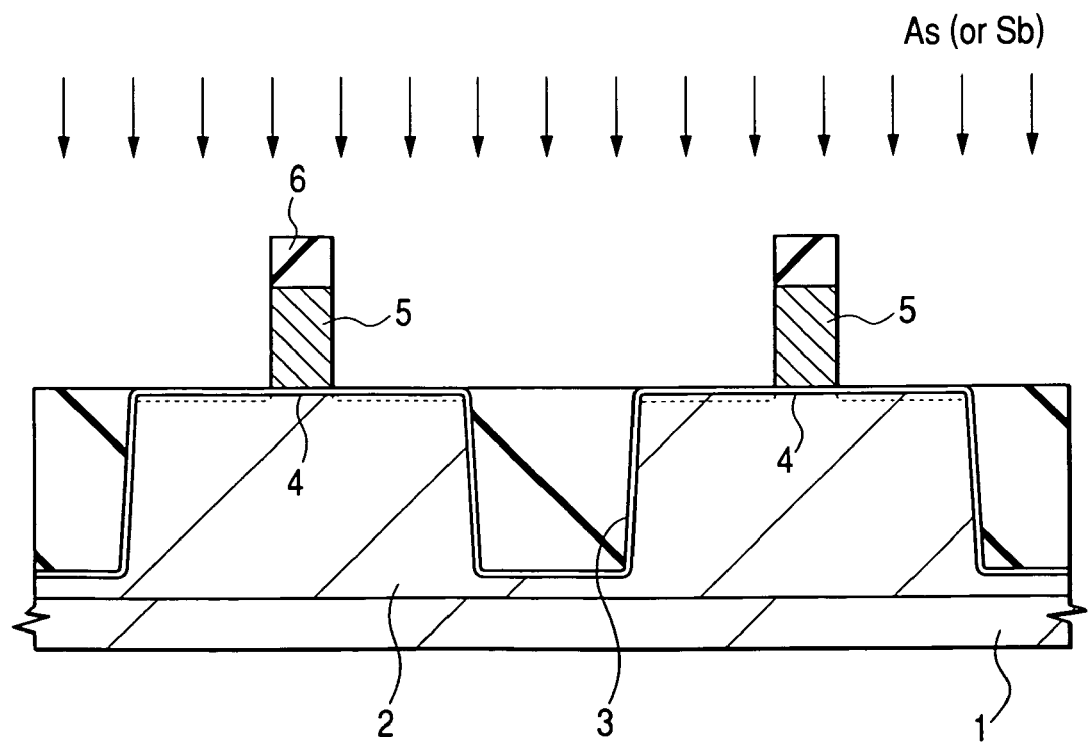
FIG. 4 is a main component sectional view of the semiconductor substrate showing the manufacturing method of the semiconductor integrated circuit device continuing to FIG. 3.

Next, as shown in FIG. 4, an As (arsenic) is ion-implanted into the surface of the P type well 2. An accelerating energy of ion-implantation is taken as a low energy of about 3 keV to introduce the As into an extremely shallow region of the p type well 2, and a doze amount thereof is taken as about $5.0 \times 10^{15}/cm^2$. A thin insulator is formed in advance in the sidewall of the gate electrode 5, and the As may be ion-implanted with this insulator (and the gate electrode 5) as a mask. By so doing, the intervals between the end portion of a source and drain of a high impurity concentration to be formed later and the end portion of the gate electrode 5 can be changed (offset source and drain structure), and therefore, a punch through withstand pressure of the MOSEFET can be enhanced.

Further, in place of the As, a Sb (antimony) can be ion-implanted. Heretofore, as a n type impurity for forming the extension region of the n channel type MISFET, the As and the P have been used. This is because, as long as the thermal equilibrium process such as the lamp annealing and the like is applied, they surpass the Sb regarding solubility limit. However, though the As and the P have a problem in that they easily become inactivated by the heat treatment performed in other steps after the activation by the heat treatment, the Sb is hard to be deactivated.

As described later, in the present embodiment, by one nano second to 999 nano seconds short time annealing process using the YAG laser beam, a silicon crystal doped with the n type impurity is raised to its soluble temperature, and is melted and recrystallized. In this way, the Sb inferior to the As and the P regarding solubility limit in the conventional lamp annealing can be doped above the solubility limit, and therefore, the n type extension region of an ultra shallow junction and a low resistance hard to be deactivated by the heat treatment of other steps can be achieved.

Figure 5:
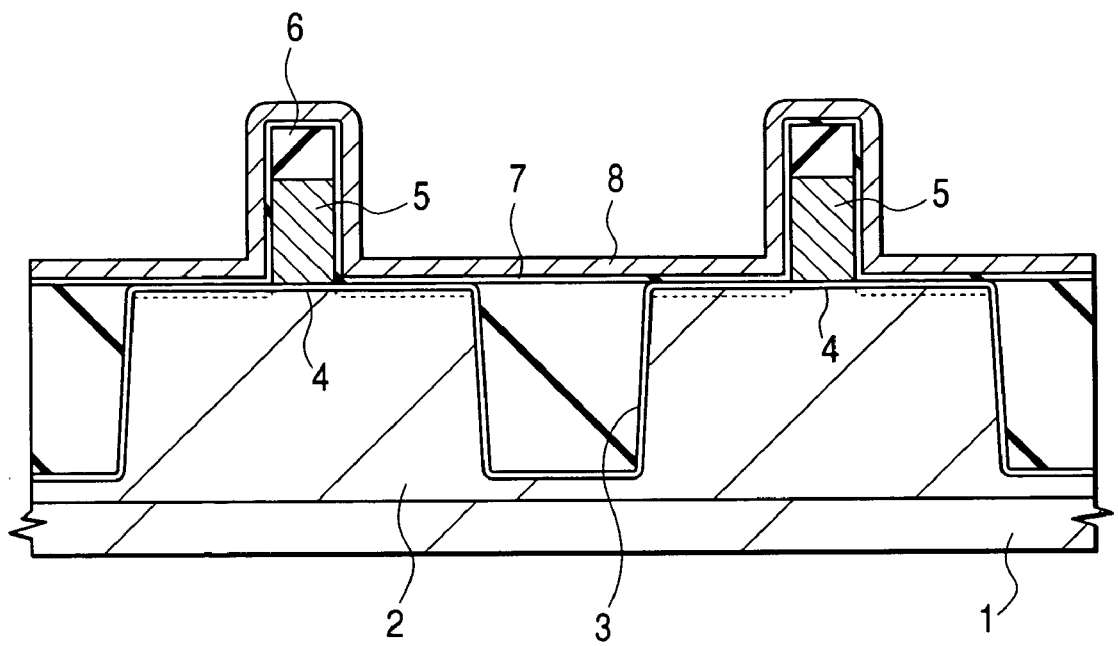
FIG. 5 is a main component sectional view of the semiconductor substrate showing the manufacturing method of the semiconductor integrated circuit device continuing to FIG. 4.

Next, as shown in FIG. 5, a surface protection layer 7 is deposited on the substrate 1, and subsequently, an energy absorber layer 8 is deposited on the surface protection layer 7. Here, the surface protection layer 7 is formed for the purpose of preventing the energy absorber layer 8 and the substrate 1 from reacting as well as of transferring the heat of the energy absorber layer 8 heated by the laser beam to the substrate 1, and a material having chemically thermally steady and good thermal conductivity is used. Here, for example, the oxidized silicon layer of about 10 nm in thickness deposited by the CVD method is used, but an alumina ($Al_2O_3$) layer, a silicon nitride layer or a lamination of these layers and the oxidized silicon layer may be used. Meanwhile, as for the energy absorber layer 8, a material, which can be heated like a metal by the laser beam in a short time and transfer its heat rapidly to the substrate 1, is used. Here, for example, a lamination of a Ti (titan) layer of 10 nm in thickness deposited by a sputtering method and a W layer of 50 nm in thickness is used, but other metal layers may be used.

Figure 6:
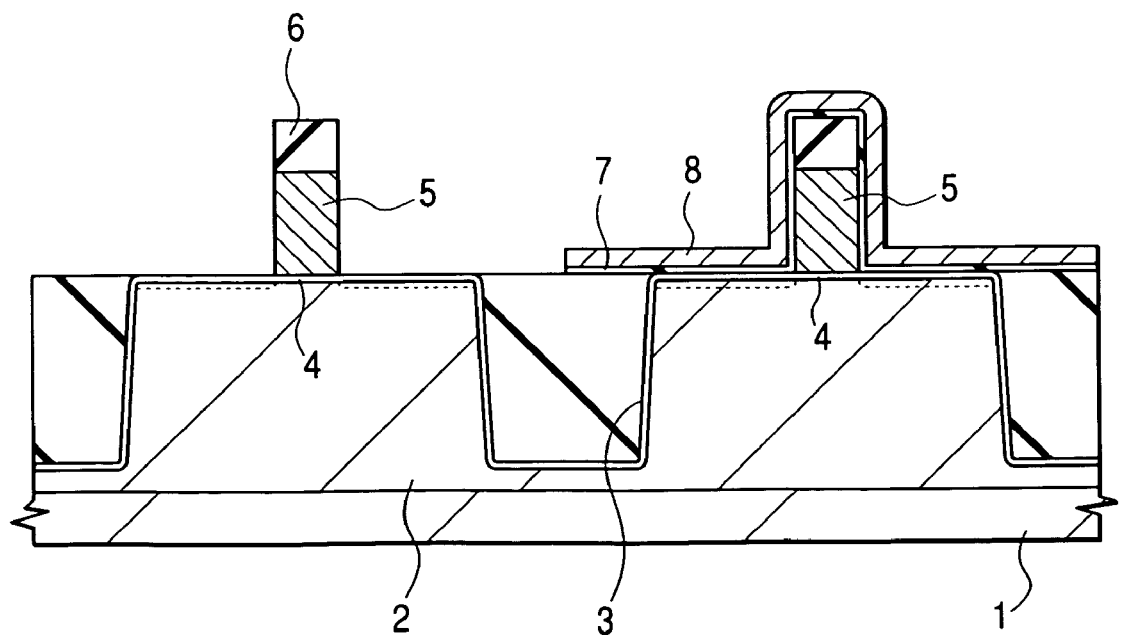
FIG. 6 is a main component sectional view of the semiconductor substrate showing the manufacturing method of the semiconductor integrated circuit device continuing to FIG. 5.

In case it is desired that one portion only of the substrate 1 be heated, as shown in FIG. 6, the energy absorber layer 8 and the surface protection layer 7 are partially removed by dry etching using a photoresist layer as a mask, and these layers are left only in the region where it is desired to be heated.

Figure 7:
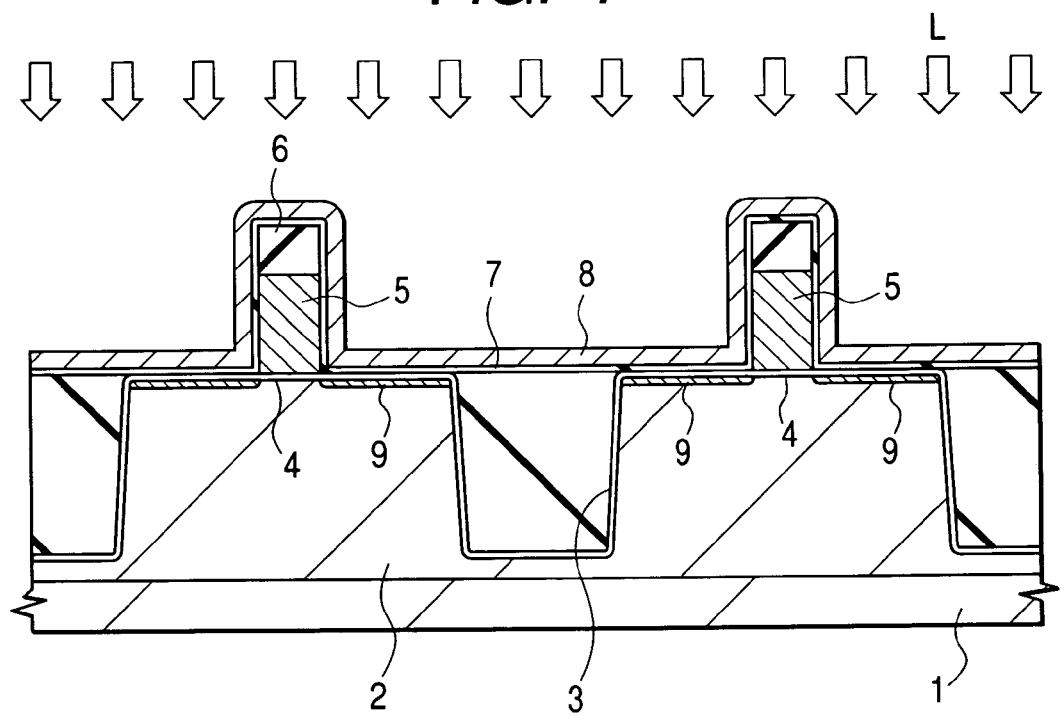
FIG. 7 is a main component sectional view of the semiconductor substrate showing the manufacturing method of the semiconductor integrated circuit device continuing to FIG. 6.

Next, as shown in FIG. 7, the surface of the substrate 1 is irradiated by a YAG laser beam (L) of the wavelength of 1064 nm irradiates for one nano second to 999 nano seconds. In place of the YAG laser beam (L), an arbitrary laser beam having a wavelength of not less than 200 nm can be also used.

When the surface of the substrate 1 covered by the energy absorber layer 8 is irradiated by the YAG laser beam (L) or a laser beam having a wavelength of not less than 200 nm, the energy absorber layer 8 comprising a metal layer is heated in an ultra-short time because an absorption coefficient of the laser beam is high compared to a W lamp. The heat absorbed by the energy absorber layer 8 is transferred to the substrate 1 within an ultra short-time, and heats its surface up to a soluble temperature. At this time, the surface of the p type well 2 is instantaneously melted, and is recrystallized due to a growth of solid phase. In this way, the above-described impurity is activated, and a low resistance extension region 9 is formed in an extremely shallow region of about 20 nm in depth from the surface of the p type well 2. This method is characterized in that there hardly occurs a problem of the impurity within the gate electrode 5 being dispersed to the inside of the substrate 1 to vary a threshold value voltage since a heating time is extremely short.

Figure 8:
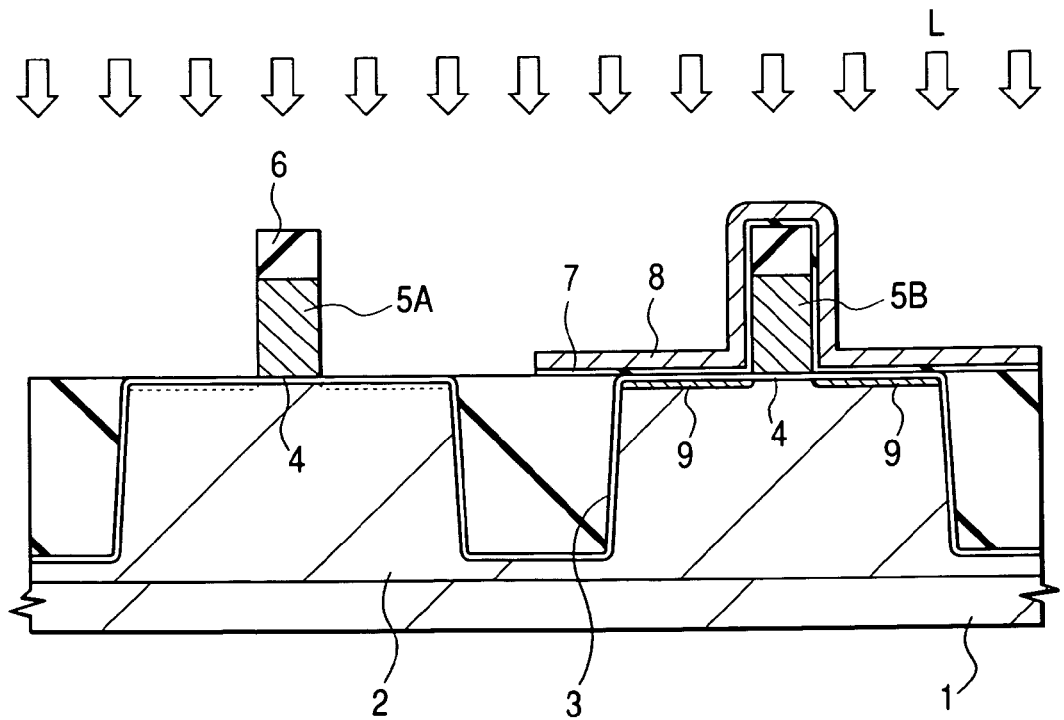
FIG. 8 is a main component sectional view of the semiconductor substrate showing the manufacturing method of the semiconductor integrated circuit device continuing to FIG. 7.

Meanwhile, as shown in FIG. 8, in case the energy absorber layer 8 is formed on a part only of the substrate 1, the surface of the substrate 1 is irradiated by the YAG laser beam (L) of the wavelength of 1064 nm or an arbitrary laser beam having the wavelength of not less than 900 nm for one nano second to 999 nano seconds. In this way, an n type extension region 9 is formed in a region only having formed energy absorber layer 8. Further, the laser beam having a wavelength of not less than 900 nm has properties of transmitting the insulator such as a poly silicon layer constituting the substrate 1, a poly silicon layer constituting a gate electrode 5 or an oxidized silicon layer and a silicon nitride layer. Consequently, the substrate 1 and the gate electrode 5 in a region where the energy absorber layer 8 is not formed are not heated to high temperatures, and moreover, the radiation time of the laser beam is extremely short such as one nano second to 999 nano seconds, and therefore, the characteristic of a MOSFET formed in this region is hard to deteriorate.

Figure 9:
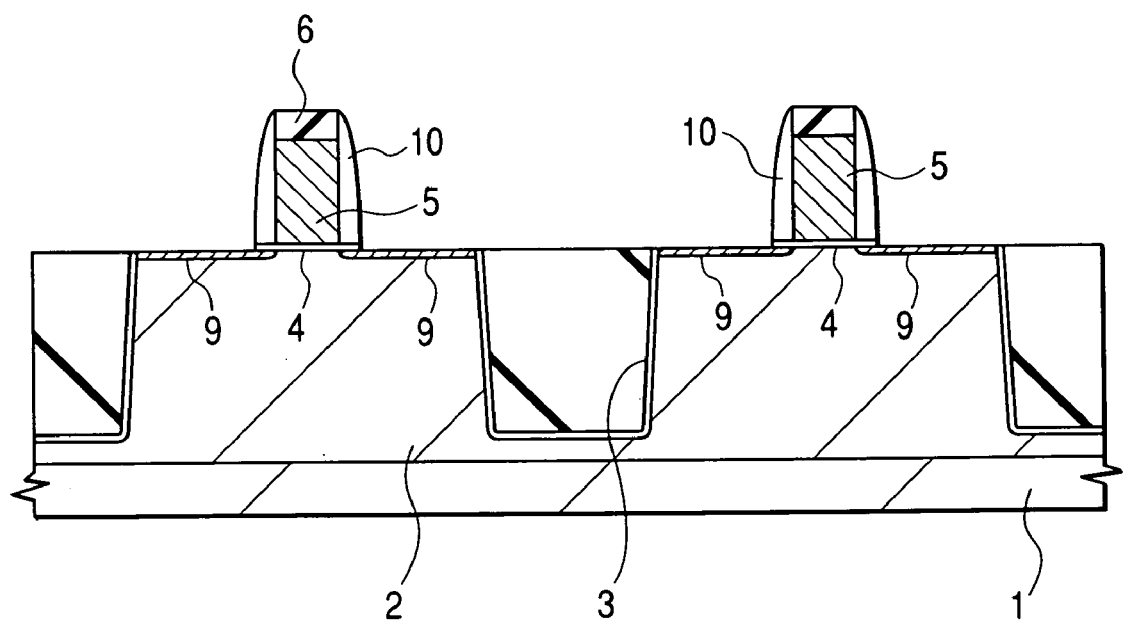
FIG. 9 is a main component sectional view of the semiconductor substrate showing the manufacturing method of the semiconductor integrated circuit device continuing to FIG. 8.

Next, after removing the energy absorber layer 8 and the surface protection layer 7 by etching, as shown in FIG. 9, a sidewall spacer 10 is formed on the side wall of the gate electrode 5. The sidewall spacer 10 is formed by depositing the oxidized silicon layer or the silicon nitride layer on the substrate 1 by the CVD method, and subsequently, and leaving this layer on the sidewall of the gate electrode 5 by anisotropically etching the layer.

Figure 10:
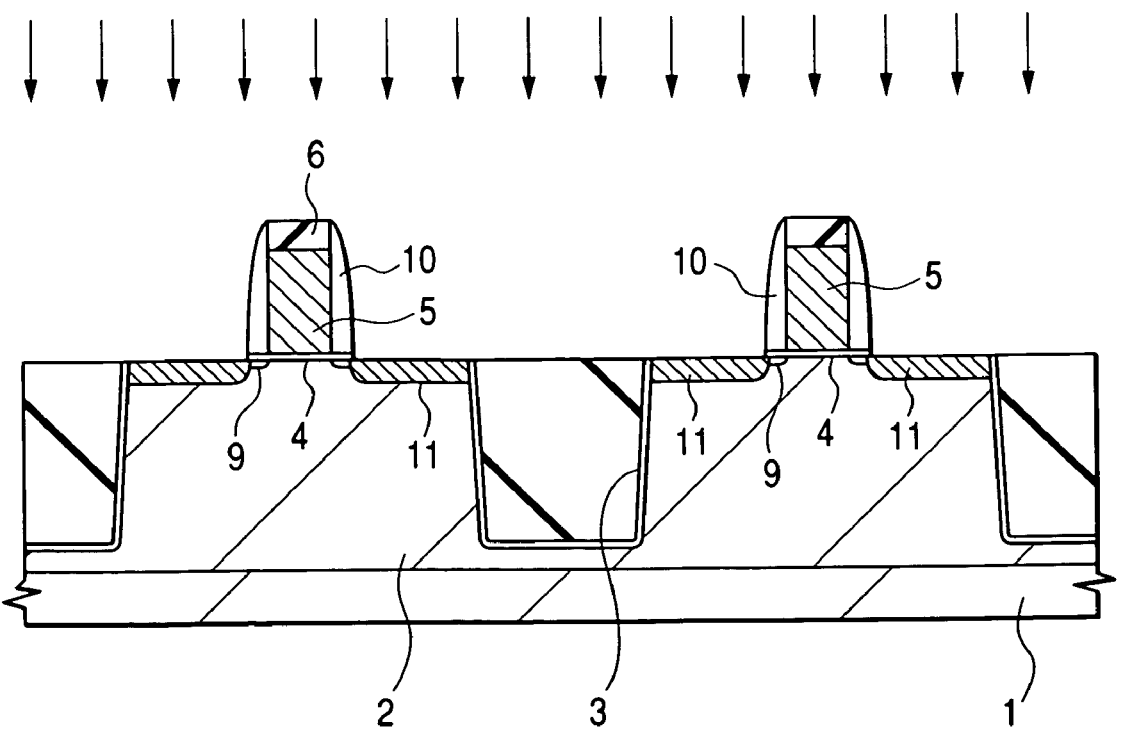
FIG. 10 is a main component sectional view of the semiconductor substrate showing the manufacturing method of the semiconductor integrated circuit device continuing to FIG. 9.

Next, as shown in FIG. 10, the P or the As is ion-implanted on the surface of the p type well 2, and subsequently, these impurities are activated by the known annealing by the W lamp, so that a $n^+$ type semiconductor region (source and drain) of a high impurity concentration is formed on the p type well 2 at both sides of the gate electrode 5. By the steps up to here, a n channel type MISFET of a LDD (Lightly Doped Drain) structure is formed in each of a memory region and a logic region.

Figure 11:
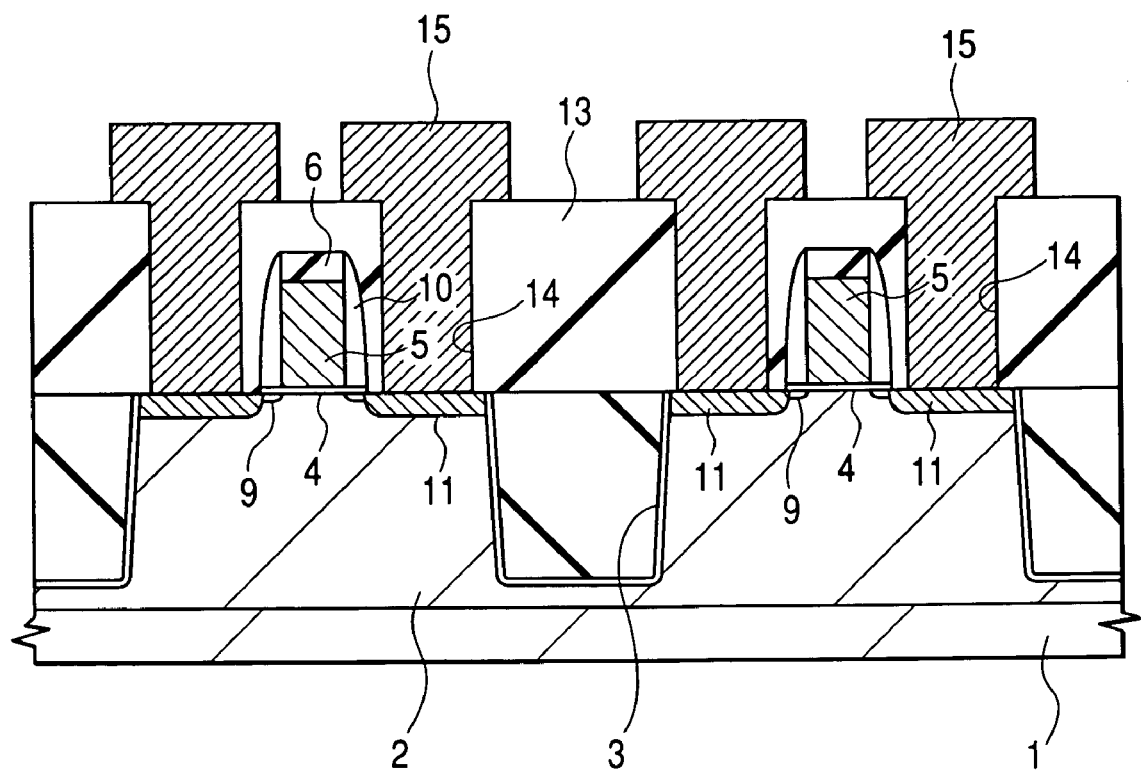
FIG. 11 is a main component sectional view of the semiconductor substrate showing the manufacturing method of the semiconductor integrated circuit device continuing to FIG. 10.

After that, as shown in FIG. 11, a contact hole 14 is formed in intermetal dielectrics 13 deposited on the upper portion of the n channel type MISFET, and subsequently, a metal interconnect 15 formed on the intermetal dielectrics 13 and the $n^+$ type semiconductor region (source and drain) of the n channel type MISFET are electrically connected through the contact hole 14.

Figure 12:
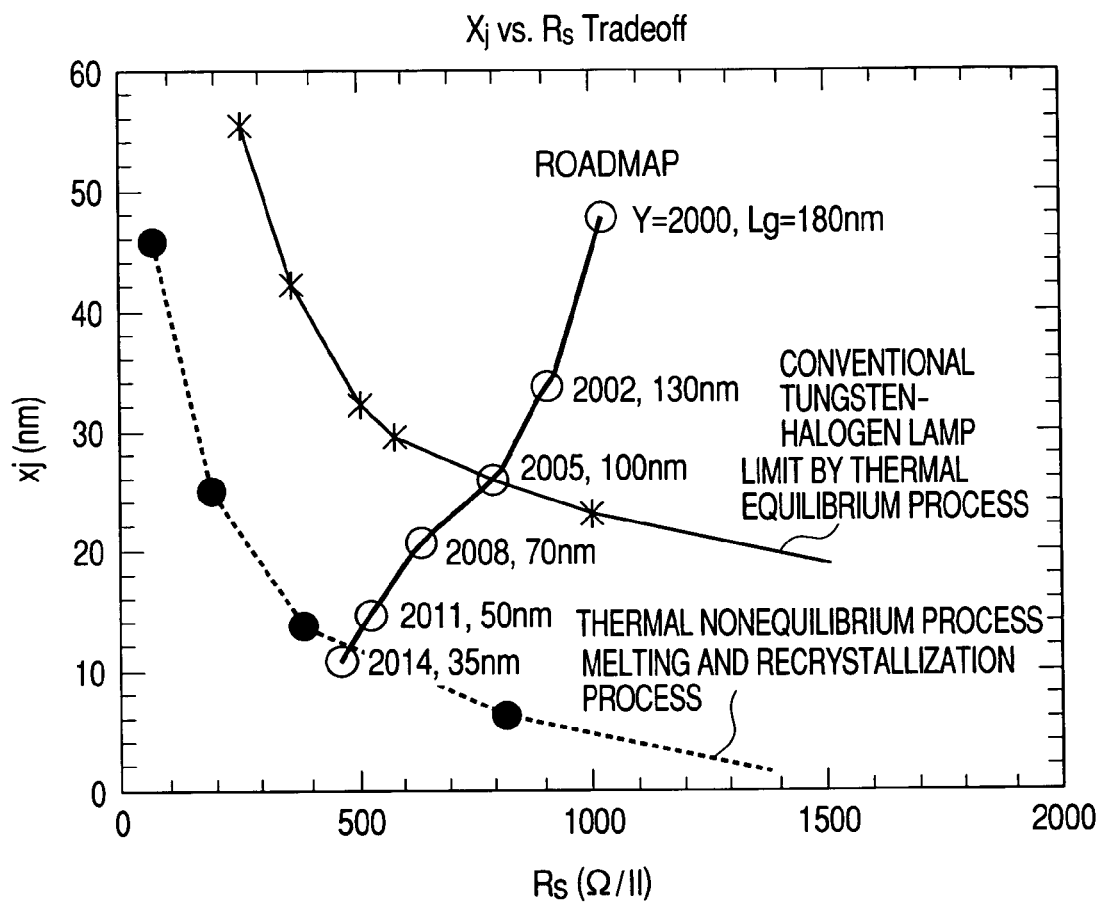
FIG. 12 is a graph in which a relationship between the sheet resistance of an extension region obtained in one embodiment of the present invention and a junction depth is compared to the extension region obtained by conventional tungsten-halogen lamp annealing.

FIG. 12 is a graph in which the relationship between a sheet resistance of the extension region 9 obtained by melting and recrystallization annealing of the substrate 1 according to the present embodiment and a junction depth (xj) is compared to the extension region obtained by conventional tungsten-halogen lamp annealing. In the present embodiment, while the silicon is heated above a melting point by melting and recrystallization process, since the radiation time of the laser beam is extremely short, the impurity can be activated above solubility limit for a short time, and the extension region 9 shallower than a conventional layer and having a low resistance can be achieved.

Second Embodiment

A second embodiment is applied to the manufacturing method of an integrated circuit constituted by a CMOSFET. Here, though a description will be made on an n channel type MOSFET, by reversing an impurity conductive type, a p channel type MISFET can be manufactured in like manner.

Figure 13:
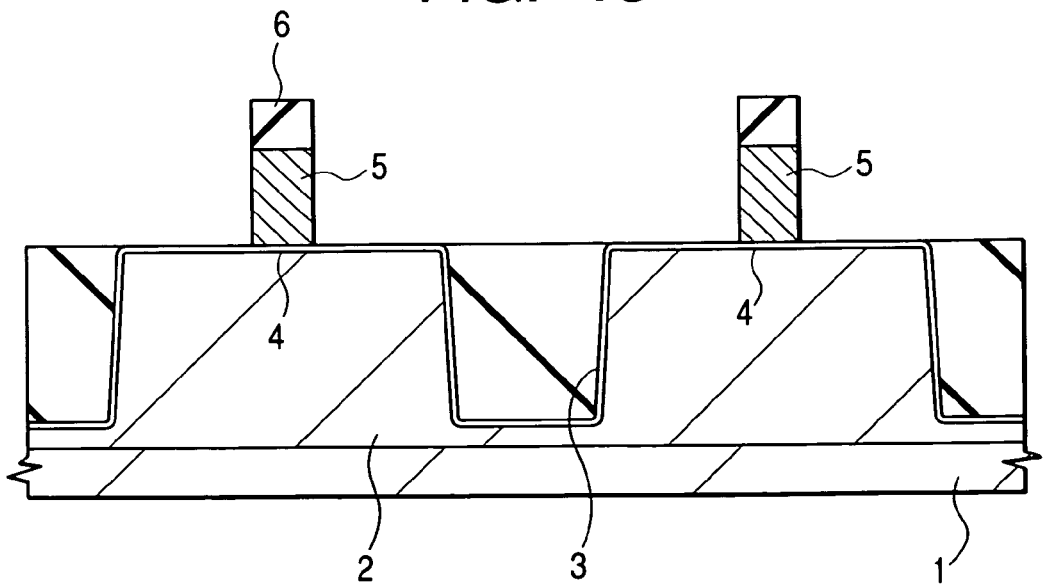
FIG. 13 is a main component sectional view of the semiconductor substrate showing the manufacturing method of the semiconductor integrated circuit device which is another embodiment of the present invention.

First, as shown in FIG. 13, according to the steps shown in FIGS. 1 to 3 of the first embodiment, a gate electrode 5 is formed on a gate insulator 4 of a p type well 2.

Figure 14:
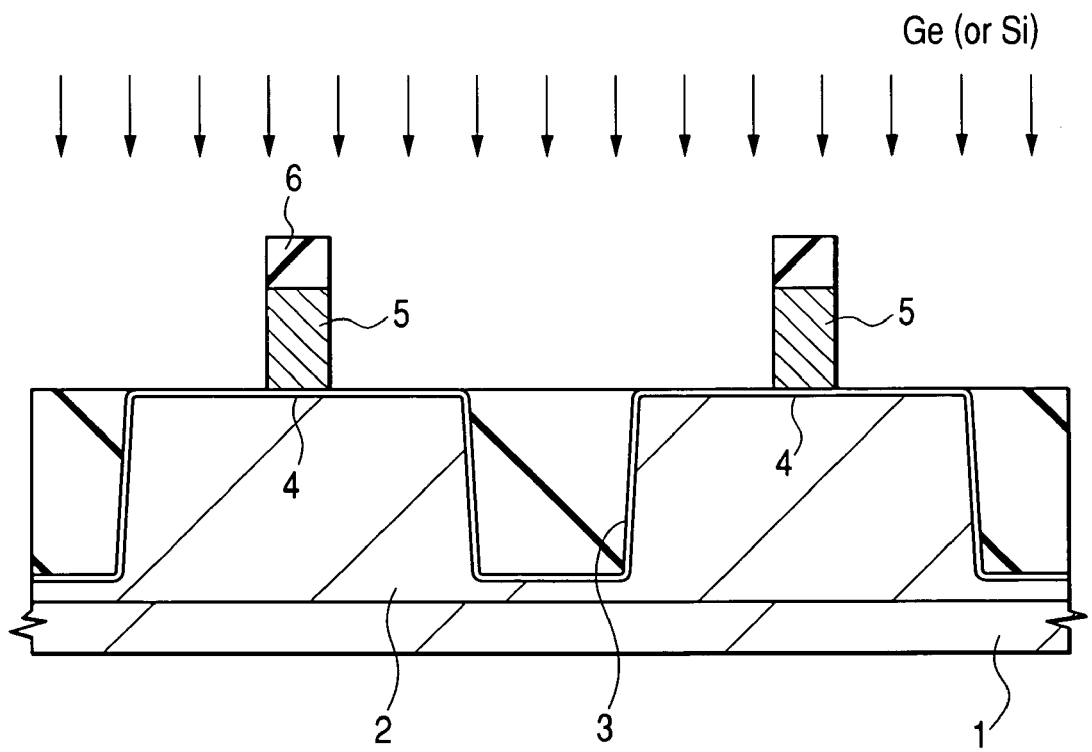
FIG. 14 is a main component sectional view of the semiconductor substrate showing the manufacturing method of the semiconductor integrated circuit device continuing to FIG. 13.

Next, as shown in FIG. 14, a Ge (germanium) or a Si (silicon) is ion-implanted in the region of about 20 nm in depth from the surface of the p type well 2. For example, in case the Ge is ion-implanted, an acceleration energy is taken about 10 keV, and a doze amount thereof is taken as about $5.0 \times 10^{14}/cm^2$. Though unillustrated, by this ion implantation, an amorphous layer is formed in the p type well 2 of the region where the Ge or the Si is introduced. The amorphous silicon is characterized in that its melting point is about 300° C. lower compared to a polycrystalline silicon.

Figure 15:
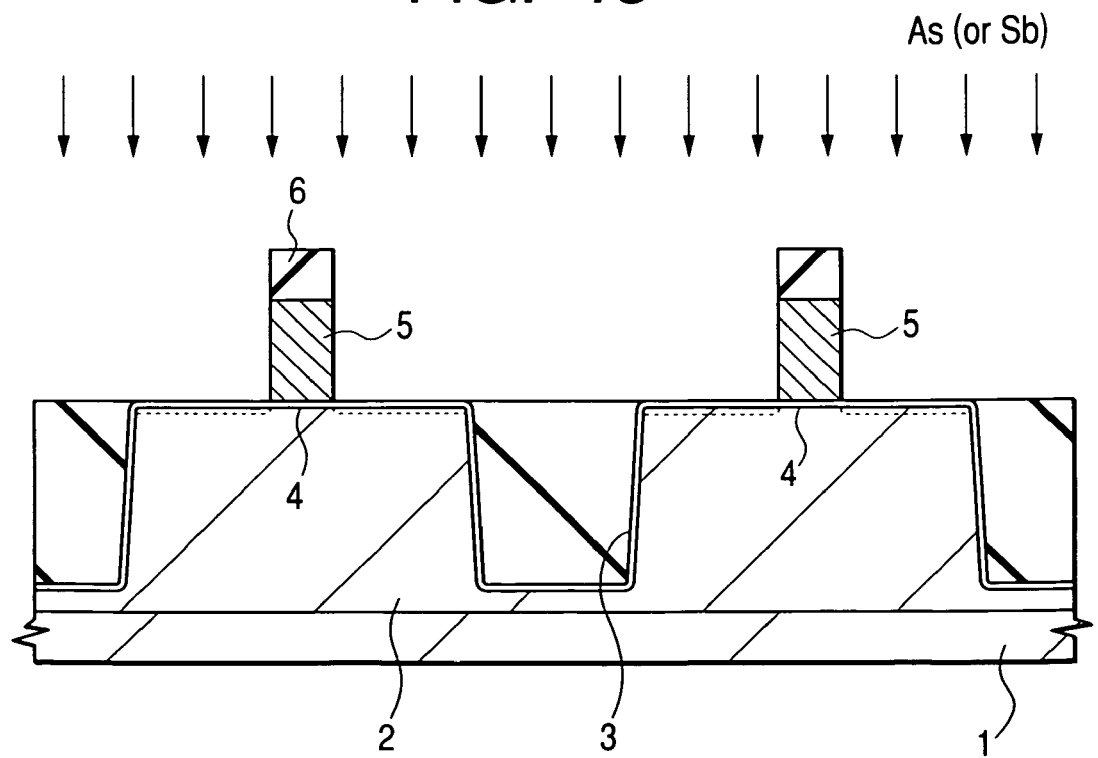
FIG. 15 is a main component sectional view of the semiconductor substrate showing the manufacturing method of the semiconductor integrated circuit device continuing to FIG. 14.

Next, as shown in FIG. 15, an As or a Sb is ion-implanted on the surface of the p type well 2 formed with the amorphous layer. The acceleration energy of the ion-implantation is taken as a low energy of about 3 keV similarly to the first embodiment, and the doze amount thereof is taken as the same level ($5.0 \times 10^{15}/cm^2$) as the first embodiment.

Figure 16:
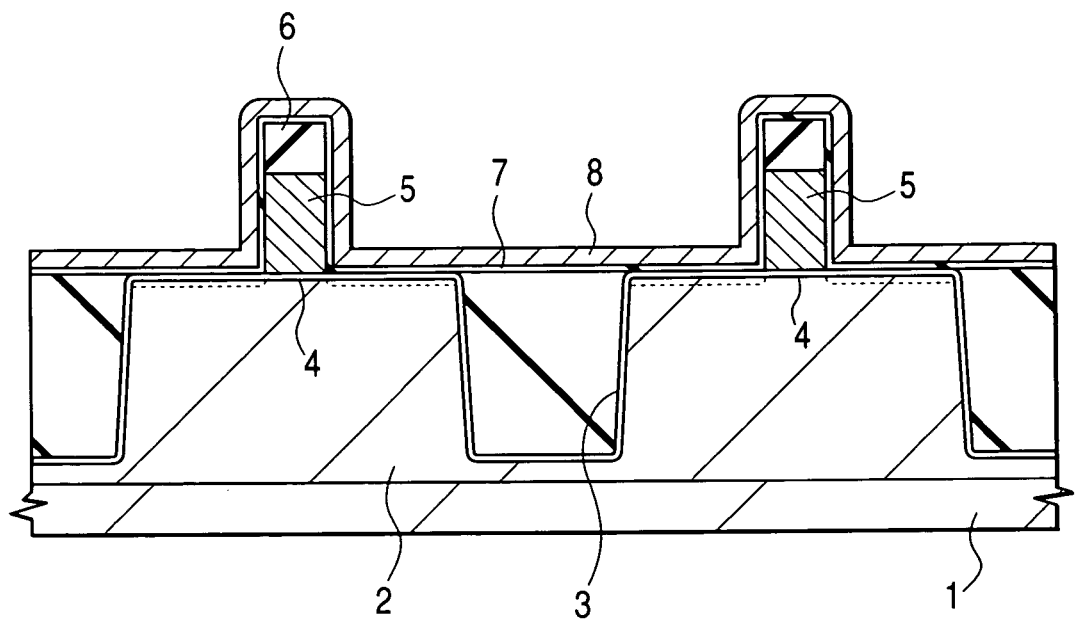
FIG. 16 is a main component sectional view of the semiconductor substrate showing the manufacturing method of the semiconductor integrated circuit device continuing to FIG. 15.
Figure 17:
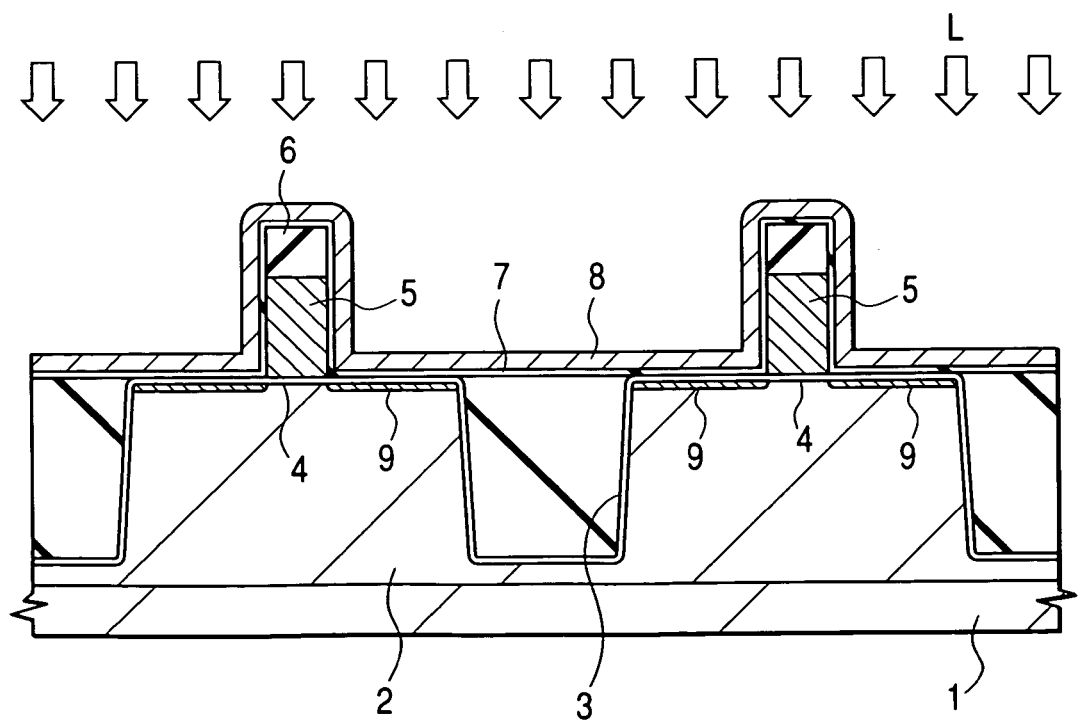
FIG. 17 is a main component sectional view of the semiconductor substrate showing the manufacturing method of the semiconductor integrated circuit device continuing to FIG. 16.

Next, as shown in FIG. 16, according to the step shown in FIG. 5 of the first embodiment, an energy absorber layer 8 and a surface protection layer 7 are formed over a substrate 1. As shown in FIG. 17, the surface of the substrate 1 is irradiated by a YAG laser beam (L) of the wavelength of 1064 nm or an arbitrary laser beam having the wavelength of not less than 200 nm for one nano second to 999 nano seconds, so that an extension region 9 is formed in an extremely shallow region of about 20 nm in depth from the surface of the p type well 2. Further, in case an energy absorber layer 8 is formed in one portion only of the substrate 1, the surface of the substrate 1 is irradiated by the YAG laser beam (L) of the wavelength 1064 nm or the arbitrary laser beam having the wavelength of not less than 900 nm for one nano second to 999 nano seconds, and an extension region 9 is formed in the surface of the p type well 2 covered by the energy absorber layer 8. The step subsequent to the above is the same as the first embodiment.

According to the present embodiment, since a Si amorphous layer 9 is formed in advance in the surface region of the p type well 2 which forms the extension region 9, it is possible to set a melting temperature of the silicon of this region at 300° C. lower than the monocrystal silicon. In this way, irradiation strength of laser beam is reduced, and a generation of defect such as dissolution, evaporation and pattern deformation and the like of the poly silicon layer which constitutes the gate electrode 5 can be controlled. Further, by controlling the depth of the amorphous layer, the depth of an extension region 9B can be also controlled.

Figure 18:
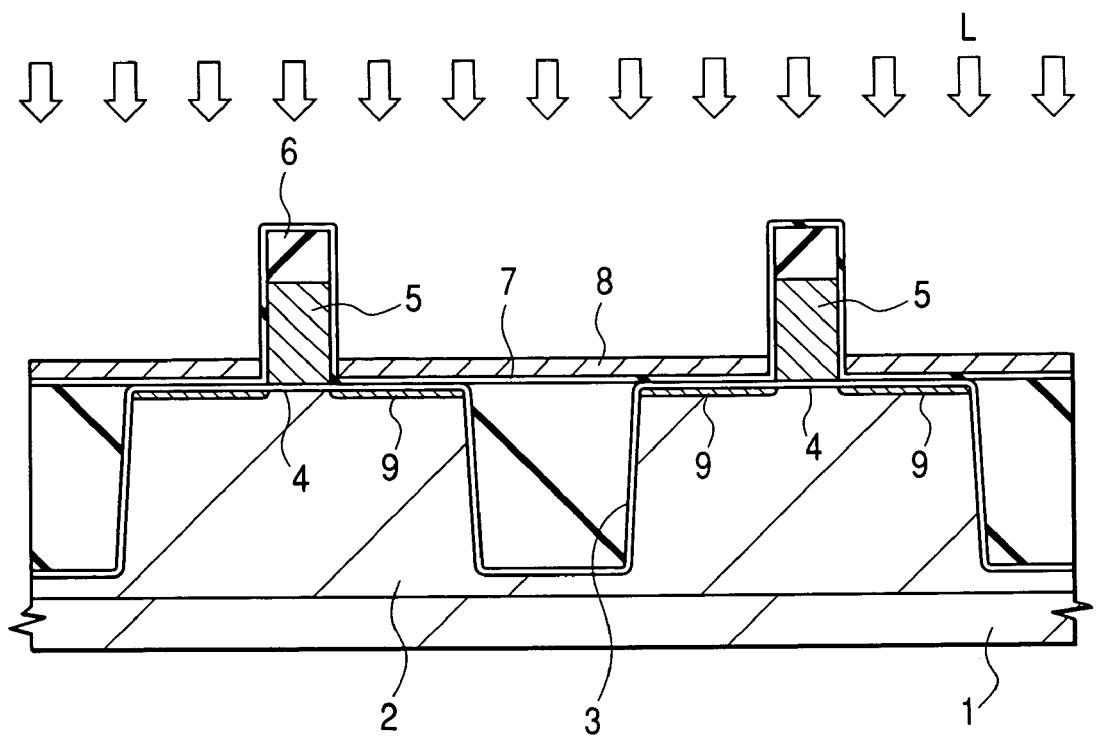
FIG. 18 is a main component sectional view of the semiconductor substrate showing the manufacturing method of the semiconductor integrated circuit device continuing to FIG. 17.

In the first embodiment and the present embodiment, while the energy absorber layer 8 is formed both in the sidewall and the upper portion of the gate electrode 5, as shown in FIG. 18, after having forming the energy absorber layer 8 over the substrate 1, the energy absorber layer 8 of the sidewall and the upper portion of the gate electrode 5 may be removed by etching. By so doing, when the laser beam is irradiated on the energy absorber layer 8, the temperature rise of the gate electrode 5 can be controlled, and therefore, a generation of defect such as dissolution, evaporation, pattern deformation and the like of the poly silicon layer which constitutes the gate electrode 5 can be controlled.

Third Embodiment

The present third embodiment is applied to a manufacturing method of an integrated circuit constituted by a CMOSFET. Here, though a description will be made on an n channel type MOSFET, by reversing an impurity conductive type, a p channel type MISFET can be manufactured in like manner.

Figure 19:
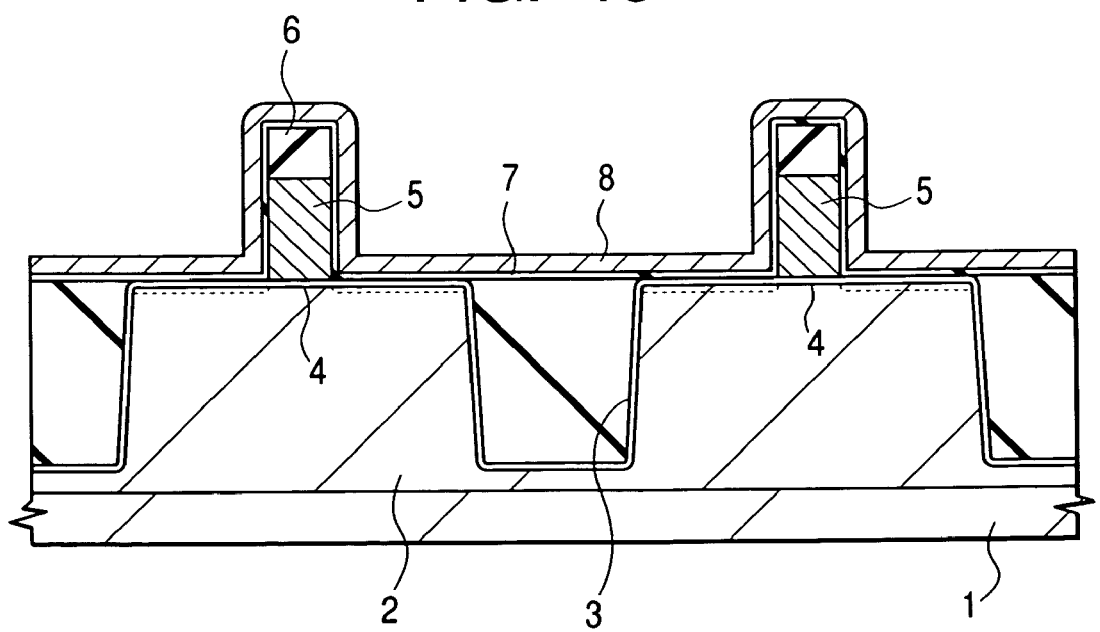
FIG. 19 is a main component sectional view of the semiconductor substrate showing the manufacturing method of the semiconductor integrated circuit device which is another embodiment of the present invention.

First, as shown in FIG. 19, according to the steps shown in FIGS. 1 to 5 of the first embodiment, a gate electrode 5 is formed on a gate insulator 4 of a p type well 2, and subsequently, an As or a Sb is ion-implanted on the surface of the p type well 2, and after that, a surface protection layer 7 and an energy absorber layer 8 are deposited over a substrate 1. Further, as described in the second embodiment, prior to the ion-implantation of an As or a Sb, a Ge or a Si is ion-implanted in a region of about 20 nm in depth from the surface of the p type well 2, so that an amorphous layer is formed in this region.

Figure 20:
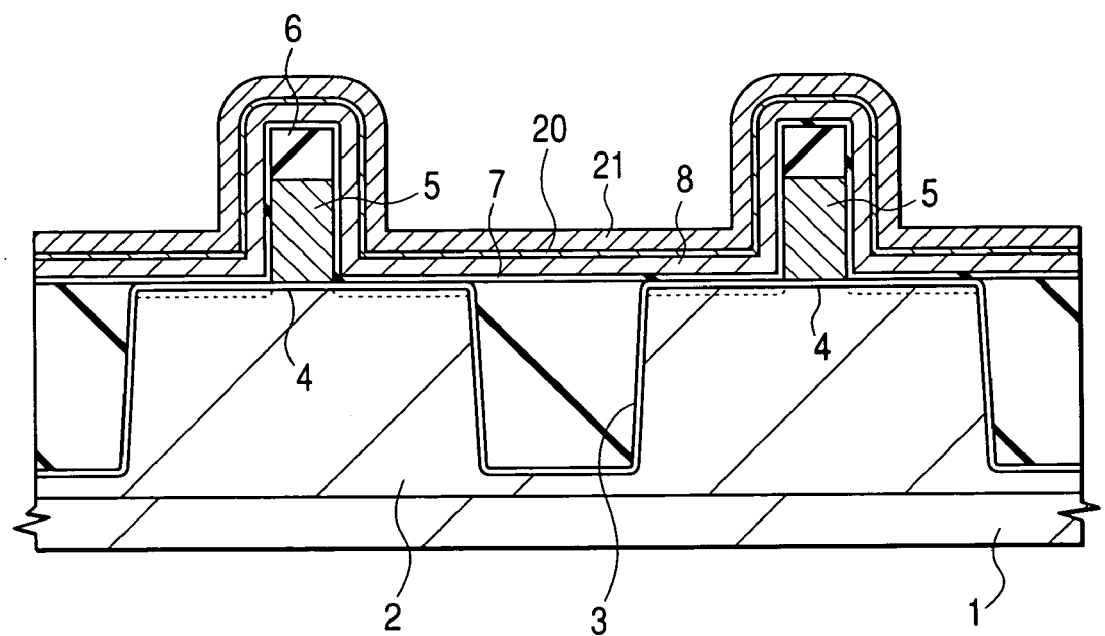
FIG. 20 is a main component sectional view of the semiconductor substrate showing the manufacturing method of the semiconductor integrated circuit device continuing to FIG. 19.

As shown in FIG. 20, an reacting protection layer 20 is deposited over the substrate 1 formed with an energy absorber layer 8, and subsequently, an overheating protection layer 21 is deposited over the reacting protection layer 20. The overheating protection layer 21 comprises, for example, a silicon layer or a Ge layer of about 50 nm in thickness deposited by a sputtering method. The reacting protection layer 20 is a layer for protecting a thermal reaction between a metal layer constituting the energy absorber layer 8 and the silicon layer or a Ge layer constituting the overheating protection layer 21, and comprises, for example, a thin TiN (titanium nitride) of not more than 10 nm in thickness deposited by a sputtering method.

Figure 21:
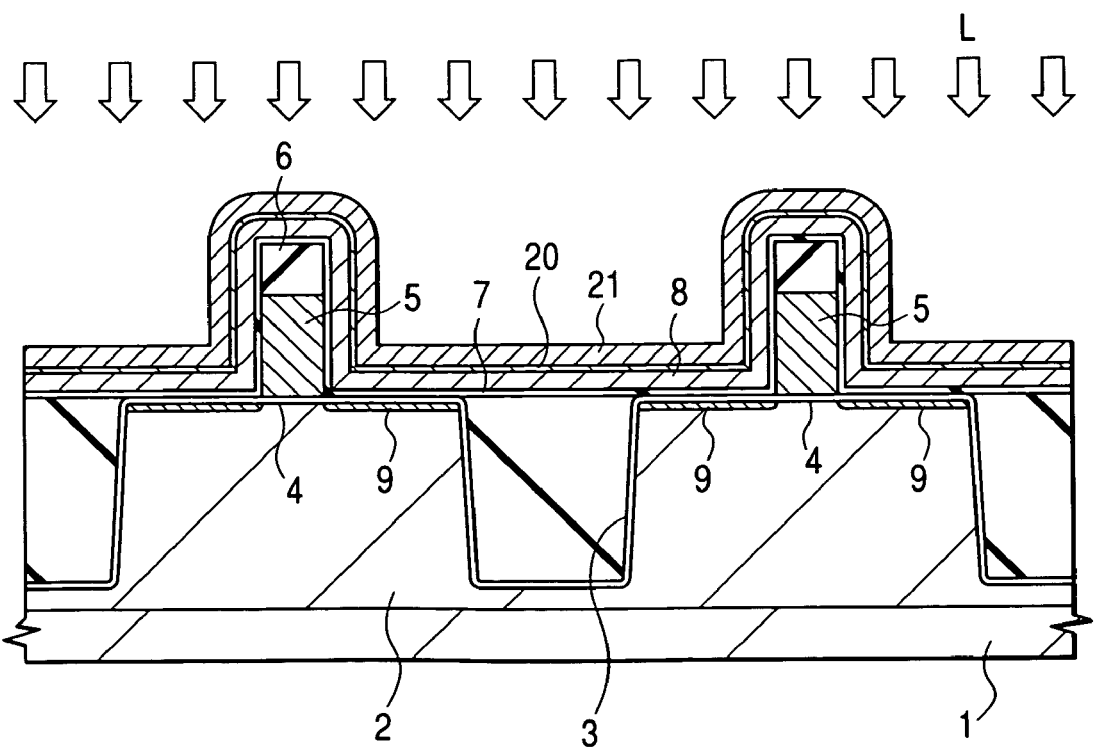
FIG. 21 is a main component sectional view of the semiconductor substrate showing the manufacturing method of the semiconductor integrated circuit device continuing to FIG. 20.

Next, as shown in FIG. 21, the surface of the substrate is irradiated by a YAG laser beam (L) of the wavelength of 1064 nm or an arbitrary laser beam having the wavelength of not less than 900 nm for one nano second to 999 nano seconds, and an extension region 9 is formed on the surface of a p type well 2 covered by the energy absorber layer 8. Alternatively, it may be irradiated by an arbitrary lamp having the wavelength of not less than 900 nm for one □ second to 999 mm seconds.

When the upper portion of the energy absorber layer 8 in a state of being deposited with the overheating protection layer 21 is irradiated by a laser beam or a lamp, that energy reaches the energy absorber layer 8 across the overheating protection layer 21, thereby heating the energy absorber layer 8. The heat absorbed by the energy absorber layer 8 is transmitted to the substrate 1, and the surface thereof is heated up to a melting temperature. Further, when the energy absorber layer 8 is heated, since the heat thereof is transmitted also to the overheating protection layer 21, the overheating protection layer 21 is also heated. When the temperature of the overheating protection layer 21 reaches close to 1700° C., the silicon layer or the Ge layer constituting the overheating protection layer 21 begins to melt, and a reflection coefficient of the laser beam or the lamp rises from about 30% of a solid phase state to 70% of a liquid phase state. As a result, a heating efficiency of the energy absorber layer 8 is lowered, and the thermal energy transmitted from the energy absorber layer 8 to the substrate 1 is also reduced, so that a melting of substrate 1 gradually progresses.

Figure 22:
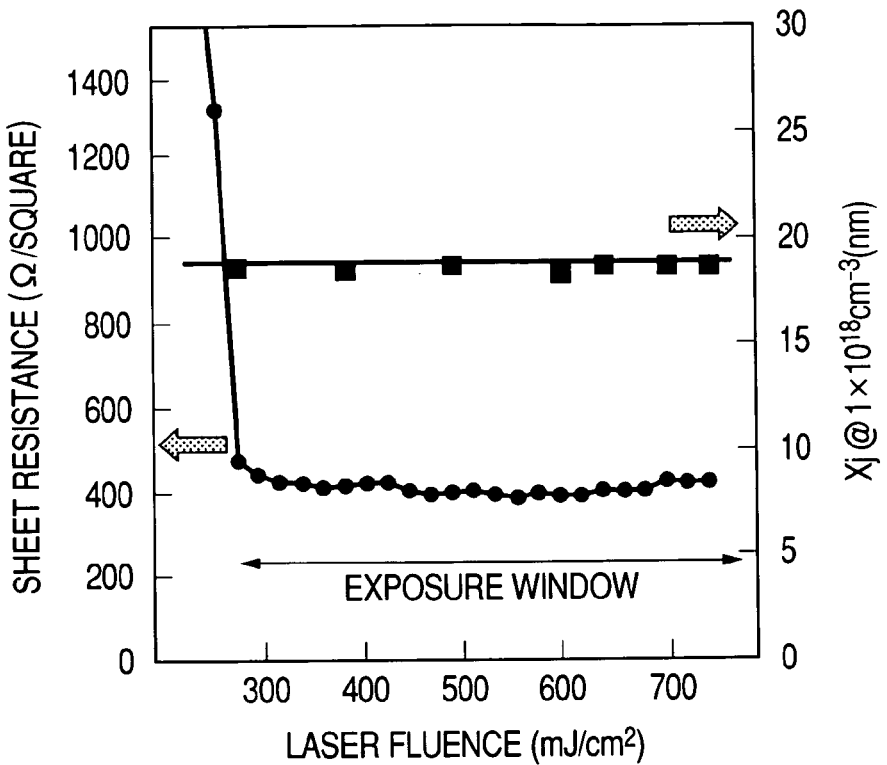
FIG. 22 is a graph showing an expanse of a process margin regarding laser beam irradiation strength by the manufacturing method of the present invention.
Figure 23:
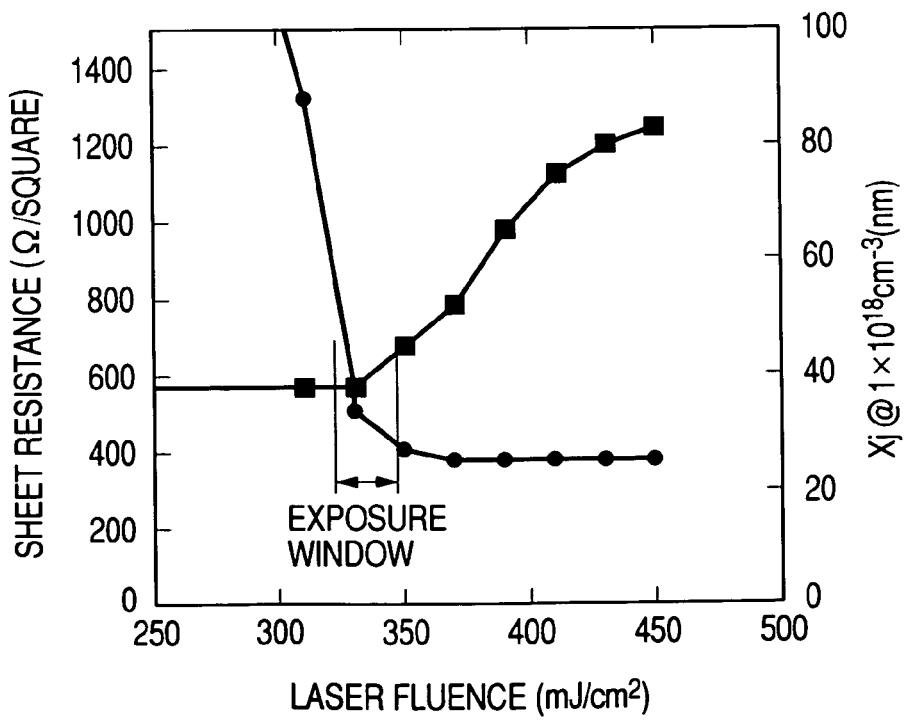
FIG. 23 is a graph showing an expanse of a process margin regarding laser beam irradiation strength by the manufacturing method of the present invention.

In this way, by forming the overheating protection layer 21 above the energy absorber layer 8, as shown in FIG. 22, a process margin regarding the laser beam irradiation strength becomes large, and therefore, a control of thermal process becomes easy. On the other hand, in case the overheating protection layer 21 is not deposited above the energy absorber layer 8 similarly to the first and second embodiments, the surface of the substrate 1 is melted in an extremely short time, and therefore, as shown in FIG. 2, the process margin regarding the laser beam irradiation strength becomes small, and a control of thermal process becomes difficult.

After that, the overheating protection layer 21, the reacting protection layer 20, and the energy absorber layer 8 are removed by etching, and the MOSFET is formed by the process as described above.

Fourth Embodiment

While, in the first to the third embodiments, the extension region 9 and the n⁺ type semiconductor region (source and drain) are formed in separate steps, they can be formed by the same step also.

Figure 24:
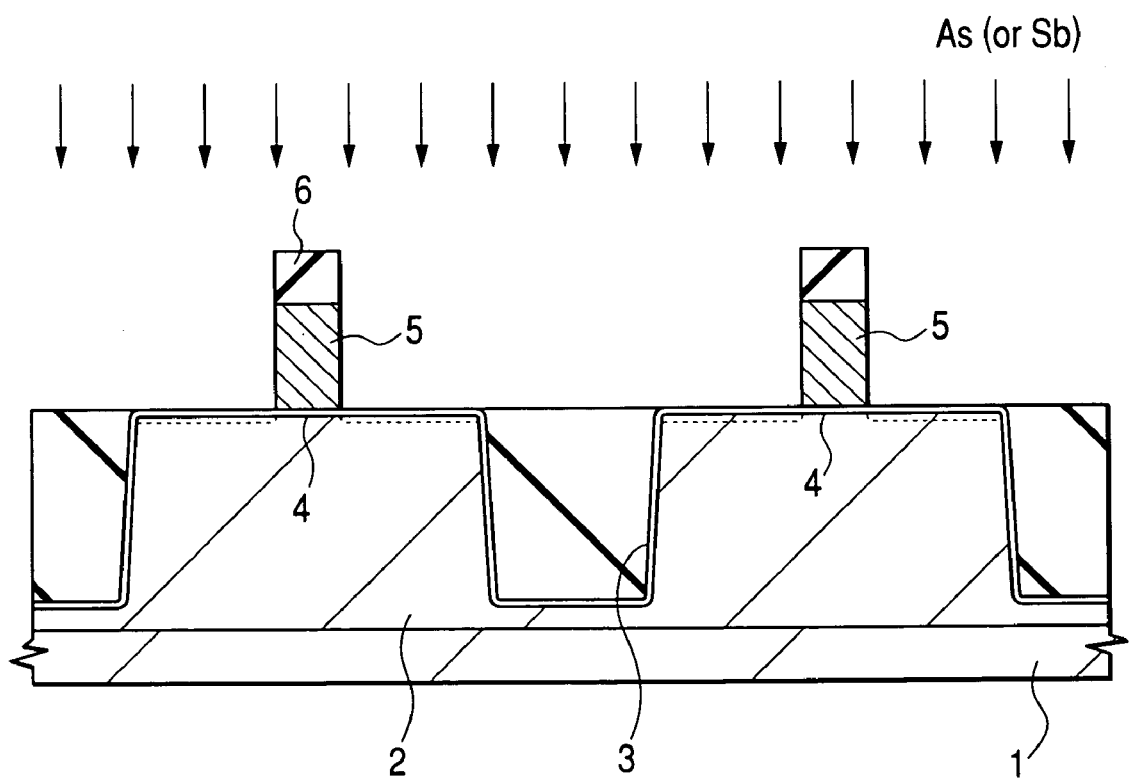
FIG. 24 is a main component sectional view of the semiconductor substrate showing the manufacturing method of the semiconductor integrated circuit device which is another embodiment of the present invention.

First, as shown in FIG. 24, according to the steps shown in FIGS. 1 to 4 of the first described embodiment, a gate electrode 5 is formed on a gate insulator 4 of a p type well 2, and subsequently, an As or a Sb is ion-implanted on the surface of the p type well 2. Further, as described in the second embodiment, prior to the ion-implanting of the As and the Sb, a Ge or a Si is ion-implanted in a region of about 20 nm in depth from the surface of the p type well 2, so that an amorphous layer may be formed on this region.

Figure 25:
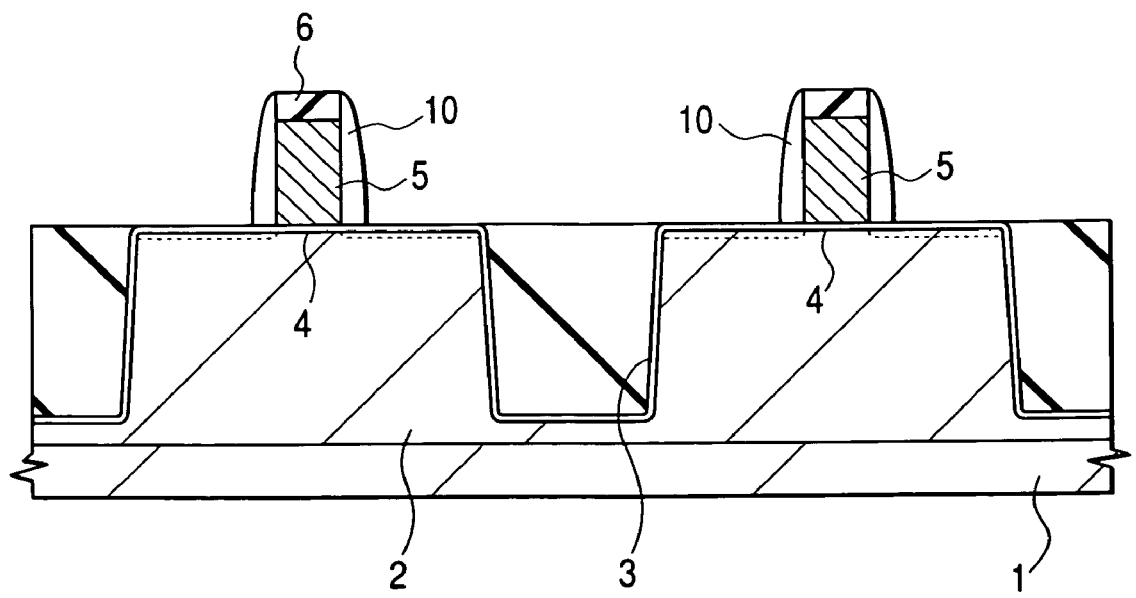
FIG. 25 is a main component sectional view of the semiconductor substrate showing the manufacturing method of the semiconductor integrated circuit device continuing to FIG. 24.

Next, as shown in FIG. 25, a sidewall spacer 10 is formed in the sidewall of the gate electrode 5. The sidewall spacer 10 is formed by depositing an oxidized silicon layer or a silicon nitride layer on a substrate 1 by a CVD method, and subsequently, by etching this layer anisotropically to leave it in the sidewall of the gate electrode. When the oxidized silicon layer or the silicon nitride layer constituting the sidewall spacer 10 is deposited by the CVD method, the deposition is made in the temperatures below 350° C. to protect the diffusion of the AS or the Sb introduced on the surface of the p type well 2.

Figure 26:
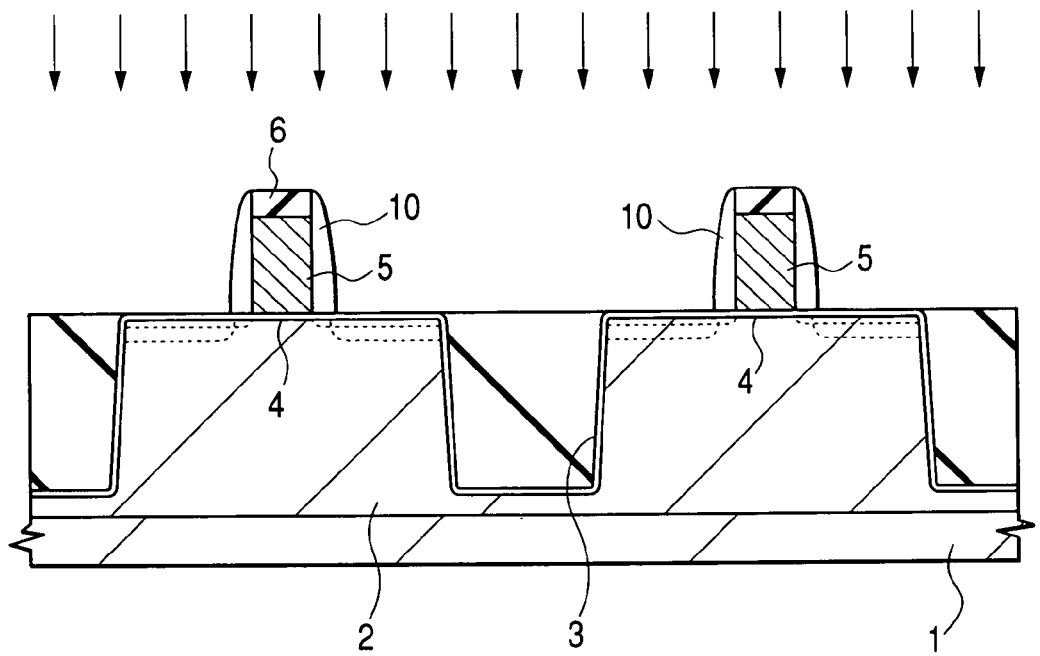
FIG. 26 is a main component sectional view of the semiconductor substrate showing the manufacturing method of the semiconductor integrated circuit device continuing to FIG. 25.

Next, as shown in FIG. 26, the AS or the Sb is ion-implanted on the surface of the p type well 2. An acceleration energy at this time is taken, for example, as about 40 keV, and a dose amount thereof is taken, for example, as about $4.0 \times 10^{15}/cm^2$. Further, prior to the ion-implantation, the Ge is ion-implanted in a region being 60 nm in depth from the surface of the p type well 2, so that the amorphous layer is formed in this region. An acceleration energy at this time is, for example, taken as about 40 keV, and a dose thereof is taken, for example, as about $5.0 \times 10^{14}/cm^2$.

A main object of the formation of the amorphous layer by the ion-implantation of the Ge is to lower a melting point of the silicon layer of the region in which an extension region 9 and a $n^+$ type semiconductor region (source and drain) are formed, and to lower a laser beam irradiation strength, that is, to enlarge a process margin. A junction depth of the extension region 9 and the $n^+$ type semiconductor region (source and drain) is also decided by the ion-implantation condition of the Ge.

Figure 27:
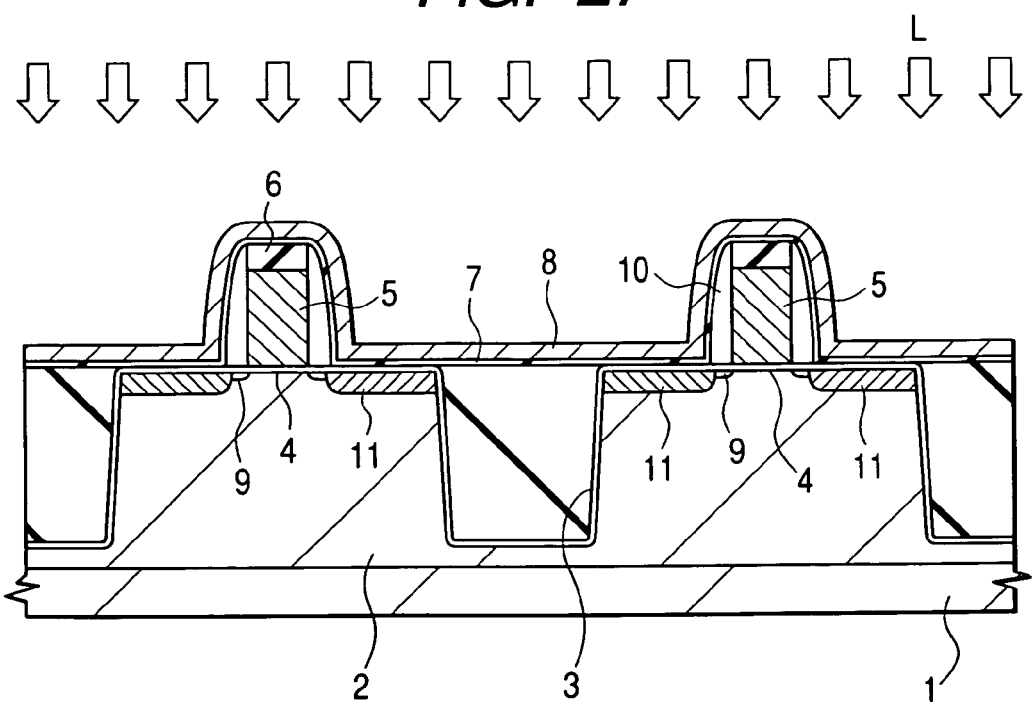
FIG. 27 is a main component sectional view of the semiconductor substrate showing the manufacturing method of the semiconductor integrated circuit device continuing to FIG. 26.

Next, as shown in FIG. 27, after depositing a surface protection layer 7 and an energy absorber layer 8 on a substrate 1, the surface of a substrate 1 is irradiated by a YAG laser beam (L) of the wavelength of 1064 nm for one nano second to 999 nano seconds. Further, in place of the YAG laser beam, an arbitrary laser beam having the wavelength of not less than 900 nm may be used. Further, an arbitrary lamp having the wavelength of not less than 900 nm may be irradiated for one □ second to 999 mm seconds.

In this way, after the amorphous layer on the surface of the p type well 2 is instantaneously melted, and is crystallized by the growth of a solid phase, the extension region 9 and $n^+$ type semiconductor region (source and drain) are simultaneously formed.

Further, to expand a process margin regarding laser beam irradiation strength, similarly to the third embodiment, a laser beam or a lamp can be also irradiated in a state of having deposited an overheating protection layer 21 over an energy absorber layer 8. However, in this case, to protect the diffusion of the As or the Sb introduced on the surface of the p type well 2, it is desirable that an reacting protection layer 20 or the overheating protection layer 21 be deposited in low temperatures not more than 450° C.

After the step shown in FIG. 26, the sidewall spacer 10 is removed once, and after that, as shown in FIG. 27, the surface protection layer 7 and the energy absorber layer 8 are deposited on the substrate 1, and the surface of the substrate 1 may be irradiated by the YAG laser beam (L) of the wavelength of 1064 nm for one nano second to 999 nano seconds. In this way, heating efficiency from the energy absorber layer 8 to the extension region 9 is enhanced.

Fifth Embodiment

While, in the first to the fourth embodiments, the case of constituting the gate electrode 5 of the MOSFET by the poly silicon layer has been described, in case a gate electrode is constituted by a metal layer (lamination of a poly silicon layer and a metal layer) to reduce a gate resistance, it is necessary to use a process where a gate electrode 5 is not melted by the irradiation of a YAG laser beam.

Figure 28:
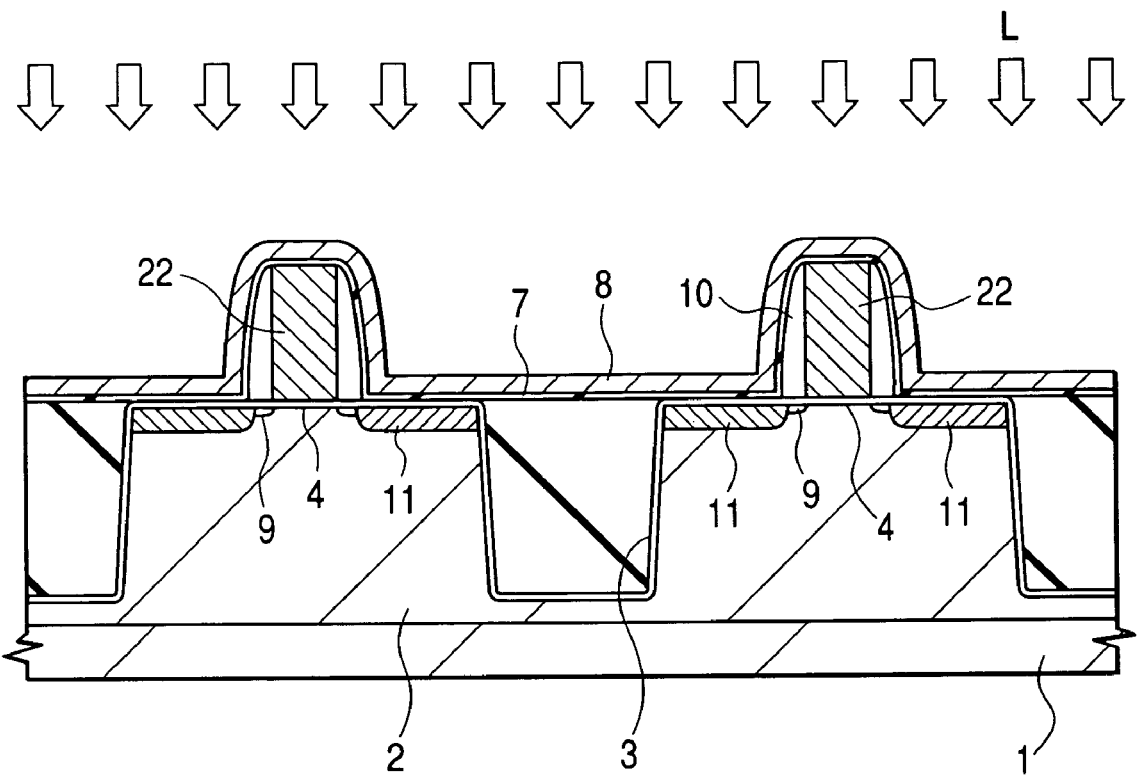
FIG. 28 is a main component sectional view of the semiconductor substrate showing the manufacturing method of the semiconductor integrated circuit device which is another embodiment of the present invention.

First, as shown in FIG. 28, by using the process described in the fourth embodiment, an extension region 9 and a $n^+$ type semiconductor region (source and drain) are simultaneously formed on the surface of a p type well 2. However, in the step up to here, a dummy electrode 22 comprising a poly silicon layer is formed on a gate insulator 4, and an oxidized silicon protection layer is not formed on the dummy electrode 22. Further, as described in the fourth embodiment, to expand a process margin regarding laser beam irradiation strength, an overheating protection layer 21 may be formed above an energy absorber layer 8. Further, in this case also, a sidewall spacer 10 is removed once, and after that, a surface protection layer 7 and the energy absorber layer 8 may be deposited so as to be subjected to annealing.

Figure 29:
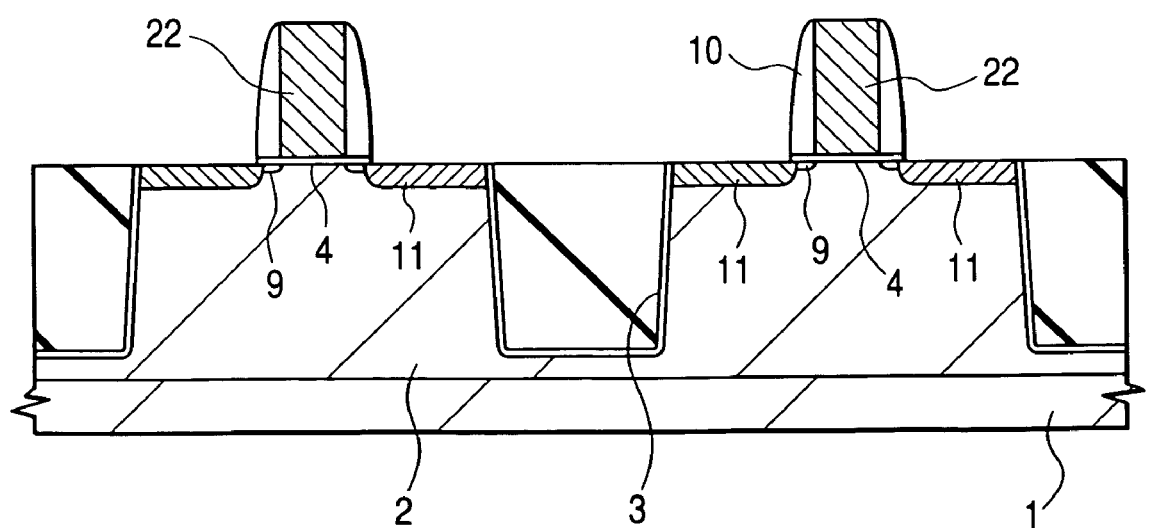
FIG. 29 is a main component sectional view of the semiconductor substrate showing the manufacturing method of the semiconductor integrated circuit device continuing to FIG. 28.
Figure 30:
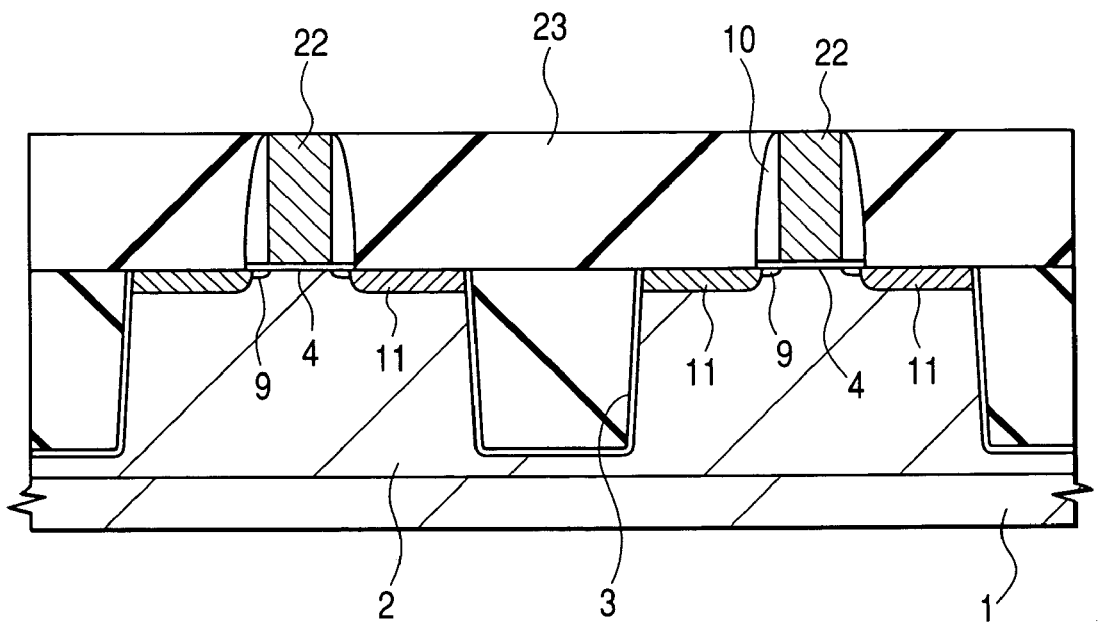
FIG. 30 is a main component sectional view of the semiconductor substrate showing the manufacturing method of the semiconductor integrated circuit device continuing to FIG. 29.

Next, as shown in FIG. 29, the energy absorber layer 8 and the surface protection layer 7 are removed by etching, and after that, as shown in FIG. 30, an oxidized silicon layer 23 higher in depth than the dummy electrode 22 is deposited on a substrate 1 by a CVD method, and subsequently, by using chemical mechanical polishing, the height of the surface of the oxidized silicon layer 23 is polished and flattened until it becomes the same as the height of the dummy electrode 22.

Figure 31:
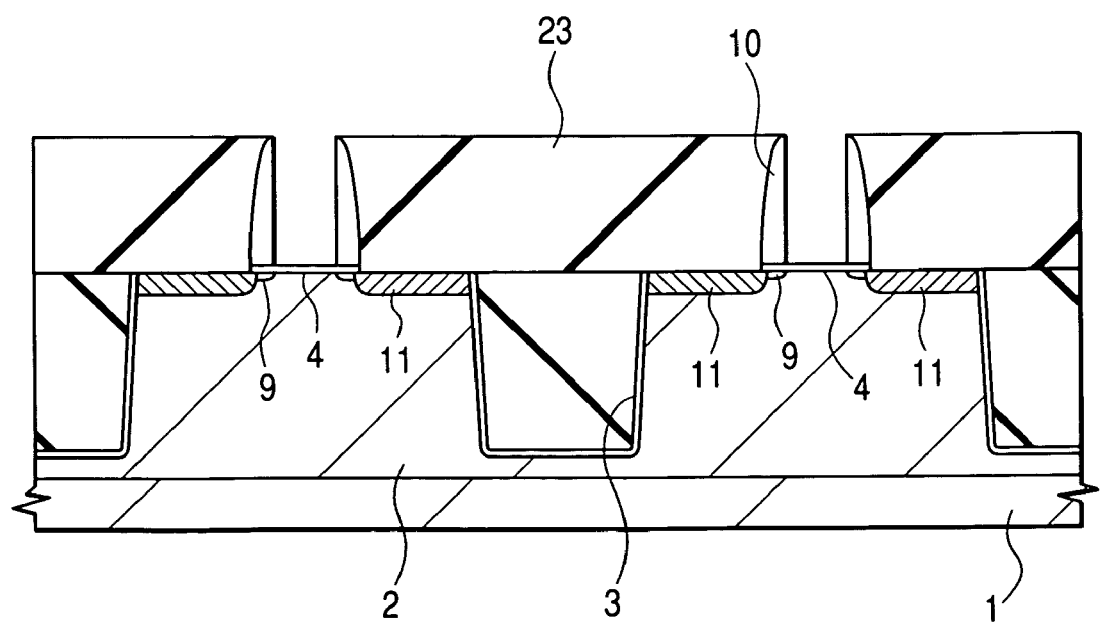
FIG. 31 is a main component sectional view of the semiconductor substrate showing the manufacturing method of the semiconductor integrated circuit device continuing to FIG. 30.
Figure 32:
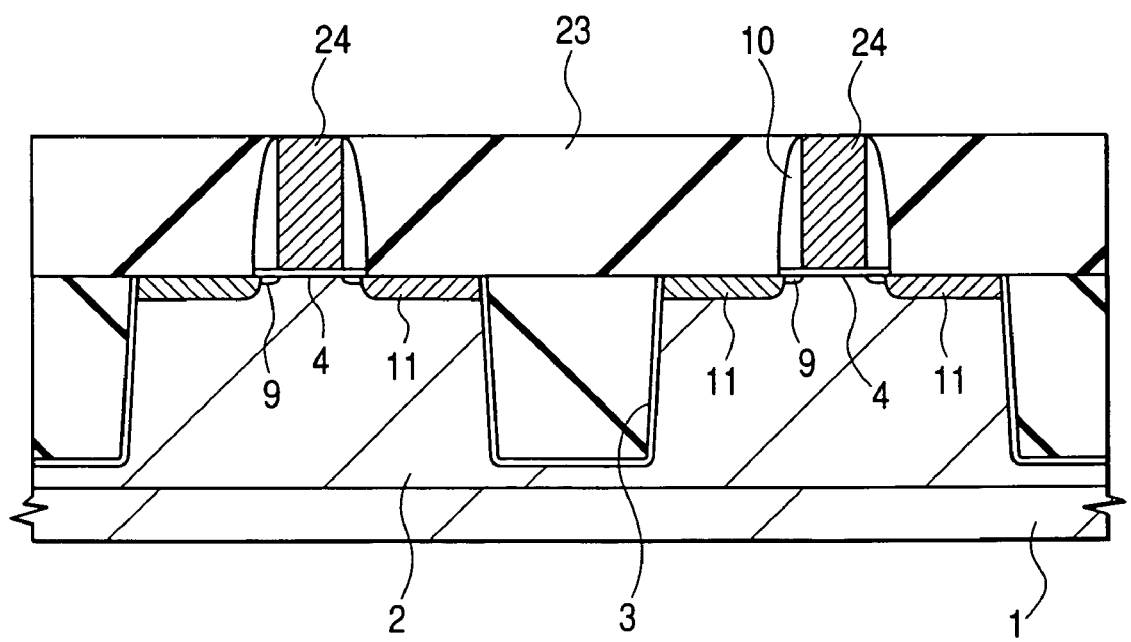
FIG. 32 is a main component sectional view of the semiconductor substrate showing the manufacturing method of the semiconductor integrated circuit device continuing to FIG. 30.

Next, as shown in FIG. 31, the poly silicon layer constituting the dummy electrode 22 is removed by etching, and after that, as shown in FIG. 32, a gate electrode 24 is formed by embedding a metal layer such as W in a region removed from the dummy electrode 22. To form the gate electrode 24, the W layer is deposited on the oxidized silicon layer 23 including the region removed from the dummy electrode 22, and after that, the unwanted W layer over the oxidized silicon layer 23 may be removed by chemical mechanical polishing.

In this way, by forming a gate electrode 24 after an extension region 9 and the $n^+$ type semiconductor region (source and drain) having been formed, the gate electrode 24 constituted by the metal layer can be prevented from being melted by the irradiation of the laser beam at the time of forming the extension region 9 and the $n^+$ type semiconductor region (source and drain).

Sixth Embodiment

Figure 33:
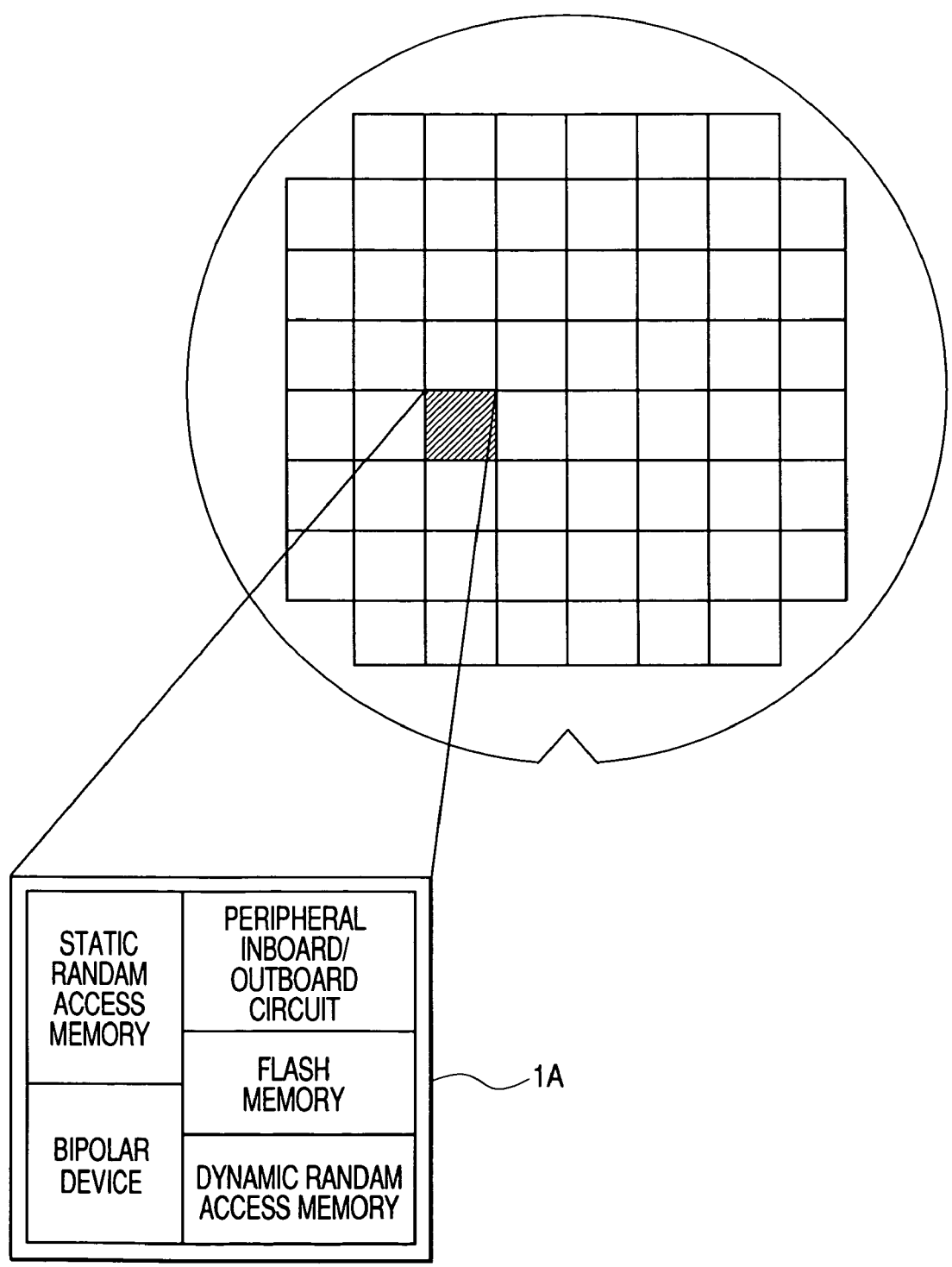
FIG. 33 is a top view of a semiconductor ware and a semiconductor chip explaining a circuit constitution of a consolidated LSI becoming a target of the manufacturing method of the present invention.

In the first to the fifth embodiments, though a case as applied to the integrated circuit constituted by the CMOS-FET has been described, for example, as shown in FIG. 33, the embodiments can be also adapted to an LSI where a MOS memory (SRAM, DRAM and Flash Memory), a peripheral inboard/outboard circuit, a bipolar circuit and the like are consolidated in a piece of semiconductor chip 1A. In this case, the above-described energy absorber layer 8 is selectively formed and subjected to laser beam annealing on a region only where it is desired that an extension region 9 of a shallow junction and a low resistance be formed, so that a MOSFET having the extension region 9 of a shallow junction and a low resistance can be formed without deteriorating the elements formed in other regions.

Heretofore, in a so-called Bi-CMOSLSI consolidating a CMOS circuit and the bipolar circuit, to prevent the deterioration of a bipolar transistor due to thermal budget at the time of forming a source and drain of the CMOSFET, the bipolar transistor has been formed after the formation of a CMOSFET. However, according to the present invention, the thermal budget at the time of forming the source and drain can be reduced, so that the CMOSFET can be also formed after the formation of the bipolar transistor, thereby enhancing the degree of freedom of the design.

Further, even in the case where the memory cell of a DRAM constituted by an n channel type MOSFET and a CMOS logic circuit are consolidated, to prevent the deterioration of the memory cell of the DRAM due to thermal budget at the time of forming the source and drain of the CMOSFET, the memory cell of the DRAM has been formed after the formation of the CMOSFET. However, in this case, since the number of steps of the memory cell of the DRAM is large, there has been a problem in that the characteristic of the CMOSFET formed earlier is gradually deteriorated by a number of steps contained in the manufacturing process of the DRAM. However, according to the present invention, since the CMOSFET can be formed after the formation of the memory cell of the DRAM, the characteristic deterioration of the CMOSFET can be prevented. Further, since the thermal budget at the time of forming the source and drain of the CMOSFET can be reduced, even if the CMOSFET is formed after the formation of the memory cell of the DRAM, the deterioration of the memory cell of the DRAM can be prevented.

Thus, while the invention made by the present inventor has been specifically described based on the embodiments, it should be understood that the present invention is not limited to the above described embodiments, but changes and modifications may be made without departing from the spirit of the invention.

The present invention is suitably applied to the manufacture of the MOSFET of the shallow junction and having the low resistance source and drain.

What is claimed is:

1. A manufacturing method of a semiconductor integrated circuit device including the following steps of:
    (a) forming a gate insulator on a main surface of a semiconductor substrate, and forming a dummy gate electrode on the gate insulator;
    (b) ion-implanting a first impurity on the main surface of the semiconductor substrate subsequent to the step (a);
    (c) forming a sidewall spacer in the sidewall of the gate electrode subsequent to the step (b);
    (d) ion-implanting a second impurity of the same conductive type as the first impurity on the main surface of the semiconductor substrate subsequent to the step (c);
    (e) forming an energy absorber layer comprising a thin layer on the main surface of the semiconductor substrate subsequent to the step (d);
    (f) activating the first impurity and the second impurity by transmitting a heat of the energy absorber layer heated by the irradiation of a laser beam to the semiconductor substrate and annealing its main surface, and forming a source and drain of a MOSFET including an extension region on the main surface;
    (g) removing the energy absorber layer subsequent to the step (f);
    (h) depositing a thick insulator higher in height than the dummy gate on the main surface of the semiconductor substrate, and subsequently, exposing the upper surface of the dummy gate electrode by polishing the insulator by chemical mechanical polishing subsequent to the step (g);
    (i) removing the dummy gate electrode subsequent to the step (h); and
    (j) forming the gate electrode of a MOSFET comprising the conductive layer by filling the conductive layer mainly comprising a metal in a region removed from the dummy gate electrode subsequent to the step (i).

2. The manufacturing method of the semiconductor integrated circuit device according to claim 1, wherein the energy absorber layer mainly comprises a metal.

3. The manufacturing method of the semiconductor integrated circuit device according to claim 1, wherein the wavelength of the laser beam is not less than 200 nm.

4. The manufacturing method of the semiconductor integrated circuit device according to claim 1, wherein the wavelength of the laser beam is not less than 900 nm.

5. The manufacturing method of the semiconductor integrated circuit device according to claim 1, wherein the laser beam is a YAG laser beam.

6. The manufacturing method of the semiconductor integrated circuit device according to claim 1, wherein the dummy gate electrode comprises a conductive layer mainly comprising a polycrystalline silicon.

7. The manufacturing method of the semiconductor integrated circuit device according to claim 1, wherein the time for irradiating the laser beam on the energy absorber layer is one nano second to 999 nano seconds.

8. The manufacturing method of the semiconductor integrated circuit device according to claim 1, wherein, prior to the step (e), by ion-implanting a silicon or a germanium on the main surface of the semiconductor substrate, an amorphous layer is formed on the main surface.

9. The manufacturing method of the semiconductor integrated circuit device according to claim 1, wherein the first impurity and the second impurity are antimony.

10. The manufacturing method of the semiconductor integrated circuit device according to claim 1, wherein, prior to the step (f), an overheating protection layer for protecting an excessive thermal storage of the energy absorber layer is formed above the energy absorber layer.

11. The manufacturing method of the semiconductor integrated circuit device according to claim 10, wherein the overheating protection layer comprises a silicon layer or a germanium layer.

12. The manufacturing method of the semiconductor integrated circuit device according to claim 1, wherein, prior to the step (f), by removing a part of the energy absorber layer, the energy absorber layer is selectively left in a desired region of the main surface of the semiconductor substrate.

13. The manufacturing method of the semiconductor integrated circuit device according to claim 12, wherein a step of forming a bipolar transistor in a region not formed with the energy absorber layer among the main surface of the semiconductor substrate is included, and the bipolar transistor is formed in a step prior to the step of forming the extension region.

14. The manufacturing method of the semiconductor integrated circuit device according to claim 12, wherein a step of forming a memory cell of a DRAM comprising a MOSFET and a capacitor element in the region not formed with the energy absorber layer is included, and the memory cell is formed in a step prior to the step of forming the extension region.

15. The manufacturing method of the semiconductor integrated circuit device according to claim 1, wherein the temperature for annealing the main surface of the semiconductor substrate is higher than the melting temperature of a silicon constituting the semiconductor substrate.

16. The manufacturing method of the semiconductor integrated circuit device according to claim 1, wherein, prior to the step (e), a step of removing once the sidewall spacer formed in the sidewall of the gate electrode is further included.

* * * * *